United States Patent
Kim et al.

(10) Patent No.: US 9,895,991 B2
(45) Date of Patent: Feb. 20, 2018

(54) METHOD AND APPARATUS ESTIMATING STATE OF BATTERY

(71) Applicant: Samsung Electronics Co., Ltd., Suwon-si (KR)

(72) Inventors: Jinho Kim, Yongin-si (KR); Tae-Won Song, Yongin-si (KR); Ju-Wan Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 175 days.

(21) Appl. No.: 14/878,053

(22) Filed: Oct. 8, 2015

(65) Prior Publication Data

US 2016/0214500 A1 Jul. 28, 2016

(30) Foreign Application Priority Data

Jan. 22, 2015 (KR) .......................... 10-2015-0010692

(51) Int. Cl.
| | |
|---|---|
| *H02J 7/00* | (2006.01) |
| *H02J 7/04* | (2006.01) |
| *G01R 31/36* | (2006.01) |
| *B60L 11/18* | (2006.01) |

(52) U.S. Cl.
CPC ...... *B60L 11/1861* (2013.01); *G01R 31/3679* (2013.01); *H02J 7/007* (2013.01); *H02J 7/0021* (2013.01); *H02J 7/0047* (2013.01); *H02J 2007/005* (2013.01); *Y02T 10/7055* (2013.01)

(58) Field of Classification Search
CPC ......... H02J 7/0021; H02J 7/0047; H02J 7/007

USPC ..................... 320/132, 162; 702/63
See application file for complete search history.

(56) References Cited

U.S. PATENT DOCUMENTS

| | | | | |
|---|---|---|---|---|
| 7,719,416 | B2 * | 5/2010 | Arms ................... | B64C 27/006 307/151 |
| 8,060,323 | B2 * | 11/2011 | Taniguchi .......... | G01R 31/3651 320/132 |
| 8,258,751 | B2 * | 9/2012 | Esnard ............... | G01R 31/3679 320/132 |
| 8,269,502 | B2 | 9/2012 | Desprez et al. | |
| 8,446,127 | B2 | 5/2013 | Yazami et al. | |

(Continued)

FOREIGN PATENT DOCUMENTS

| | | |
|---|---|---|
| EP | 2 607 910 A2 | 6/2013 |
| JP | 3395694 B2 | 2/2003 |

(Continued)

OTHER PUBLICATIONS

Extended European Search Report dated May 20, 2016 in counterpart European Patent Application No. 15187243.9.

*Primary Examiner* — M'Baye Diao
(74) *Attorney, Agent, or Firm* — NSIP Law

(57) ABSTRACT

A method and apparatus estimating a state of a battery are provided. A battery life estimation apparatus may charge a battery using a normal charge rate (C-rate) during a charging interval of a charging cycle and a low charge rate (C-rate) in a low-rate charging interval of the charging cycle, may compare a determined change in an electrical physical quantity of the battery over time to a reference curve, corresponding to a life of the battery, for an initial state of the battery, in the low-rate charging interval, and may estimate the life of the battery based on a result of the comparing.

29 Claims, 17 Drawing Sheets

(56) References Cited

U.S. PATENT DOCUMENTS

| | | | |
|---|---|---|---|
| 2003/0157409 A1* | 8/2003 | Huang | H01M 2/1686 |
| | | | 429/306 |
| 2009/0070052 A1* | 3/2009 | Taniguchi | G01R 31/3651 |
| | | | 702/63 |
| 2013/0069660 A1 | 3/2013 | Bernard et al. | |
| 2013/0271089 A1 | 10/2013 | Yazami et al. | |
| 2014/0074416 A1 | 3/2014 | Park et al. | |
| 2015/0236383 A1* | 8/2015 | Koller | H01M 10/48 |
| | | | 429/50 |
| 2015/0369874 A1* | 12/2015 | Park | B60L 11/1851 |
| | | | 702/63 |
| 2016/0161567 A1* | 6/2016 | Park | G01R 31/3648 |
| | | | 702/63 |
| 2016/0209473 A1* | 7/2016 | You | G01R 31/3679 |

FOREIGN PATENT DOCUMENTS

| | | |
|---|---|---|
| JP | 2003-173812 A | 6/2003 |
| JP | 3768457 B2 | 2/2006 |
| JP | 5024455 B2 | 9/2012 |
| KR | 10-1027305 B1 | 3/2011 |
| KR | 10-1293630 B1 | 7/2013 |
| KR | 10-1303596 B1 | 8/2013 |
| KR | 10-2014-0052558 A | 5/2014 |
| KR | 10-1399388 B1 | 5/2014 |

\* cited by examiner

METHOD AND APPARATUS ESTIMATING STATE OF BATTERY

CROSS-REFERENCE TO RELATED APPLICATION(S)

This application claims the benefit under 35 USC 119(a) of Korean Patent Application No. 10-2015-0010692 filed on Jan. 22, 2015, in the Korean Intellectual Property Office, the entire disclosure of which is incorporated herein by reference for all purposes.

BACKGROUND

1. Field

The following description relates to a method and apparatus estimating a state of a battery.

2. Description of Related Art

As environmental concerns and energy resource issues become more important, an electric vehicle (EV) has been highlighted as a vehicle of the future. The EV may not emit exhaust fumes, and may produce less noise, than a gasoline based vehicle. In such an EV, a battery may be formed in a single pack with a plurality of rechargeable and dischargeable secondary cells and even used as a main power source for the EV.

Thus, in such an EV, the battery may operate as a fuel tank would for an engine of a gasoline powered vehicle. Thus, to enhance a safety of a user of the EV, a state of the battery may be checked.

Recently, research is being conducted to increase a convenience of a user while more accurately monitoring a state of a battery.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

One or more embodiments provide a battery life estimation apparatus including a battery charger configured to charge a battery using a normal charge rate (C-rate) during a charging interval of a charging cycle and a low C-rate during a low-rate charging interval of the charging cycle, and a life estimator configured to use at least one processing device to estimate a life of the battery based on a determined change in an electrical physical quantity of the battery over time, in the low-rate charging interval. The electrical physical quantity may be a voltage.

The C-rate may be a unit of measure that represents a rate of a current applied to the battery to charge the battery with respect to a capacity of the battery.

The battery charger may be configured to charge the battery at the low C-rate in the low-rate charging interval based on one of a constant current (CC) charging mode, a constant voltage (CV) charging mode, and a constant power (CP) charging mode implemented for the charging interval.

The battery charger may be configured to set the low-rate charging interval, within the charging cycle, based on at least one of a range of a voltage used to estimate the life of the battery, a charging mode, a current temperature, and a voltage of the battery.

The battery charger may be configured to set the low-rate charging interval, within the charging cycle, based on the voltage of the battery, when the charging mode of the charging interval is a CC charging mode, and configured to set the low-rate charging interval, within the charging cycle, based on a current of the battery, when the charging mode of the charging interval is a CV charging mode.

The apparatus may further include a comparator configured to compare the determined change in the electrical physical quantity to a reference curve, corresponding to a life of the battery, for an initial state of the battery.

The battery charger may be configured to charge, when the battery is in the initial state, the battery at the low C-rate in a preset charging interval, and the comparator may be configured to calculate a change in an electrical physical quantity of the battery in the initial state over time in the preset charging interval, and to generate the reference curve based on the calculated change in the electrical physical quantity of the battery in the initial state.

The preset charging interval may include an entire initial charging cycle or a preset voltage interval portion of the entire initial charging cycle.

A plurality of low-rate charging intervals may be provided in the charging cycle, and the comparator may be configured to compare the reference curve to a determined average change in an electrical physical quantity over time in the plurality of low-rate charging intervals.

The comparator may be configured to extract a measure of central tendency of the reference curve and a measure of central tendency of the electrical physical quantity over time in the plurality of low-rate charging intervals, and to compare the extracted measure of central tendency of the reference curve and the extracted measures of central tendency of the electrical physical quantity over time in the plurality of low-rate charging intervals.

The comparator may be configured to compare the reference curve to a change in the electrical physical quantity, within the low-rate charging interval, beginning at a point in time delayed by a preset period of time from a starting point of the low-rate charging interval.

The reference curve may be received from an external apparatus using a communication interface.

The battery charger may be configured to charge the battery at the low C-rate in the low-rate charging interval in response to a determination that a state of the battery satisfies a preset charging condition.

The preset charging condition may include at least one of a mileage of a driving vehicle including the battery, a number of times the battery is charged, a charging scheme of the battery, a temperature, and a voltage of the battery.

One or more embodiments provide a battery life estimation apparatus including a battery charger configured to charge a battery, in an initial state of the battery, at a low charge rate (C-rate) during a preset charging interval of an initial charging cycle, and a reference curve generator configured to use at least one processing device to calculate a change in an electrical physical quantity of the battery in the initial state over time in the preset charging interval, and to generate a reference curve based on the calculated change in the electrical physical quantity of the battery in the initial state, wherein the reference curve is configured for use in estimating a life of the battery based on charging and discharging of the battery.

The battery charger may be configured to charge the battery using a normal C-rate during a charging interval of another charging cycle and the low C-rate during a low-rate charging interval of the other charging cycle, and the apparatus may further include a life estimator configured to use at least one processing device to estimate the life of the battery based on a comparison between the reference curve and a determined change in an electrical physical quantity of the battery over time, in the low-rate charging interval.

The preset charging interval may include an entire charging cycle or a preset voltage interval portion of the entire charging cycle.

The apparatus may further include a storage configured to store the reference curve, wherein the reference curve generator may be further configured to store the generated reference curve in the storage.

The reference curve generator may be configured to transmit the reference curve to an external apparatus using a communication interface.

One or more embodiments provide a battery life estimation method including charging a battery using a normal charge rate (C-rate) during a charging interval of a charging cycle and a low C-rate during a low-rate charging interval of the charging cycle, comparing, using at least one processing device, a determined change in an electrical physical quantity of the battery over time, in the low-rate charging interval, to a reference curve corresponding to a life of the battery and for an initial state of the battery, and estimating the life of the battery based on a result of the comparing.

One or more embodiments provide a battery life estimation method including charging a battery, in an initial state of the battery, at a low charge rate (C-rate) during a preset charging interval of an initial charging cycle, and calculating, using at least one processing device, a change in an electrical physical quantity of the battery in the initial state over time in the preset charging interval and generating a reference curve based on the calculated change in the electrical physical quantity of the battery in the initial state, wherein the reference curve is configured for use in estimating a life of the battery based on charging and discharging of the battery.

The method may further include charging the battery using a normal C-rate during a charging interval of another charging cycle and the low C-rate during a low-rate charging interval of the other charging cycle, and estimating the life of the battery based on a comparison between the reference curve and a determined change in an electrical physical quantity of the battery over time, in the low-rate charging interval.

One or more embodiments provide a non-transitory computer-readable storage medium including computer readable code to cause at least one processing device to perform one or more methods of the present disclosure.

One or more embodiments provide a battery life estimation system including a battery charger configured to charge a battery using a normal charge rate (C-rate) during plural charging intervals of a charging cycle and a low C-rate during a low-rate charging interval of the charging cycle, and a life estimator configured to use at least one processing device to estimate a life of the battery based on a comparison of a determined change in an electrical physical quantity of the battery over time, in the low-rate charging interval, and battery information previously obtained for a previous charging of the battery using the low C-rate.

The determined change in an electrical physical quantity of the battery over time, in the low-rate charging interval, may be a determined slope of a voltage, over time, of the battery during the low-rate charging interval.

The determined slope of the voltage of the battery during the low-rate charging interval may be a slope of a voltage, over time, across only a lesser portion of the low-rate charging interval.

The slope of the voltage may be a variation in voltage of the battery over time in a charging curve, for the low-rate charging interval, for a current temperature, and the low C-rate may be a C-rate where the slope of the voltage for the current temperature is similar to a slope of a voltage, over time, of another charging of the battery when using the low C-rate at a substantially different temperature, for an interval of voltage values.

The low C-rate may be a C-rate where respective charging curves at substantially different temperatures have similar patterns.

Other features and aspects will be apparent from the following detailed description, the drawings, and the claims.

Figure 1:
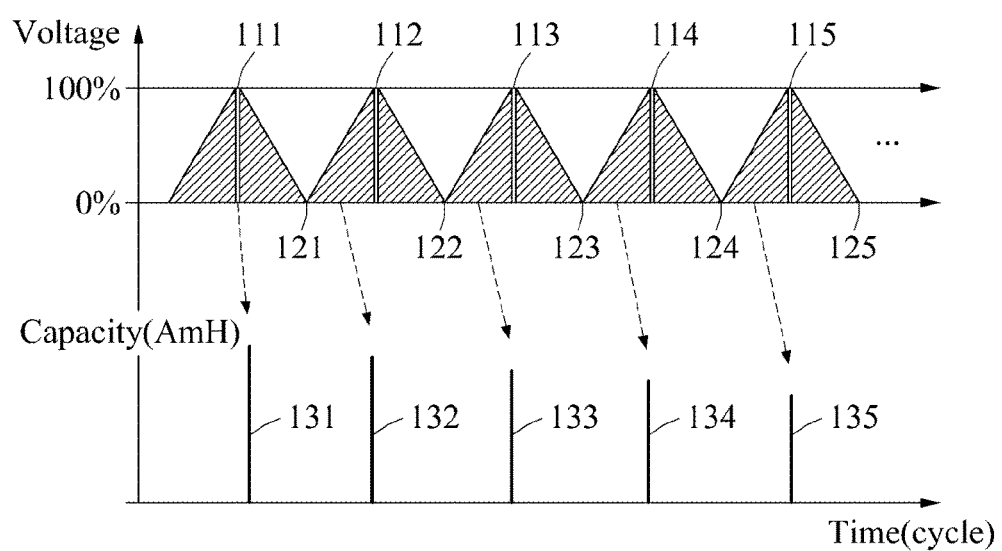
FIG. 1 illustrates an example of charge and discharge (charge/discharge) cycles of a battery.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, after an understanding of the present disclosure, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that may be well known to one of ordinary skill in the art may be omitted for increased clarity and conciseness.

The features described herein may be embodied in different forms, and are not to be construed as being limited to the examples described herein.

Various alterations and modifications may be made to the exemplary embodiments, some of which will be illustrated in detail in the drawings and detailed description. However, it should be understood that these embodiments are not construed as limited to the illustrated forms and include all changes, equivalents or alternatives within the idea and the technical scope of this disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art in view of the present disclosure. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Hereinafter, exemplary embodiments will be described in detail with reference to the accompanying drawings, wherein like reference numerals refer to like elements throughout. When it is determined a detailed description of a related known function or configuration may make a purpose of an embodiment of the present disclosure unnecessarily ambiguous in describing the embodiment, the detailed description may be omitted herein.

FIG. 1 illustrates an example of charge and discharge (charge/discharge) cycles of a battery.

The top graph of FIG. 1 shows an example of a change in a voltage of a battery over time. The battery may be fully charged and discharged multiple times. In the top graph, the horizontal axis represents time and the vertical axis represents the voltage of the battery. In FIG. 1, points in time 111, 112, 113, 114, and 115 at which battery is fully charged indicate "full charge," and points in time 121, 122, 123, 124, and 125 at which the battery is fully discharged indicate "full discharge."

In this example, a cycle associated with both charging and discharging of the battery may represent a cycle in which power of a fully charged battery is completely discharged and the battery is recharged. For example, an interval between the points in time 111 and 112 may be a single cycle. Depending on embodiment, a single charging cycle may be representative of a charging of the battery from a fully discharged or partially discharged state and to a point where the battery is not fully charged, just as a single discharging cycle may be representative of a discharging of the battery from a fully charged or partially charged state to a point where the battery is not fully discharged. A single charging cycle may also be representative of a charging of the battery from a fully discharged state or partially discharged state to a fully charged state, and a single discharging cycle may also be representative of a discharging of the battery from a fully charged or partially charged state to a fully discharged state.

The bottom graph of FIG. 1 shows an example of a change in a capacity of a battery based on full charge and discharge of the battery over time. In the bottom graph, the horizontal axis represents time and the vertical axis represents the capacity of the battery. Lines 131, 132, 133, 134, and 135 represent capacities of the battery corresponding to the points in time 111 through 115. As shown in the bottom graph, as the battery is repeatedly fully charged and discharged, the capacity of the battery may be reduced continuously.

Figure 2:
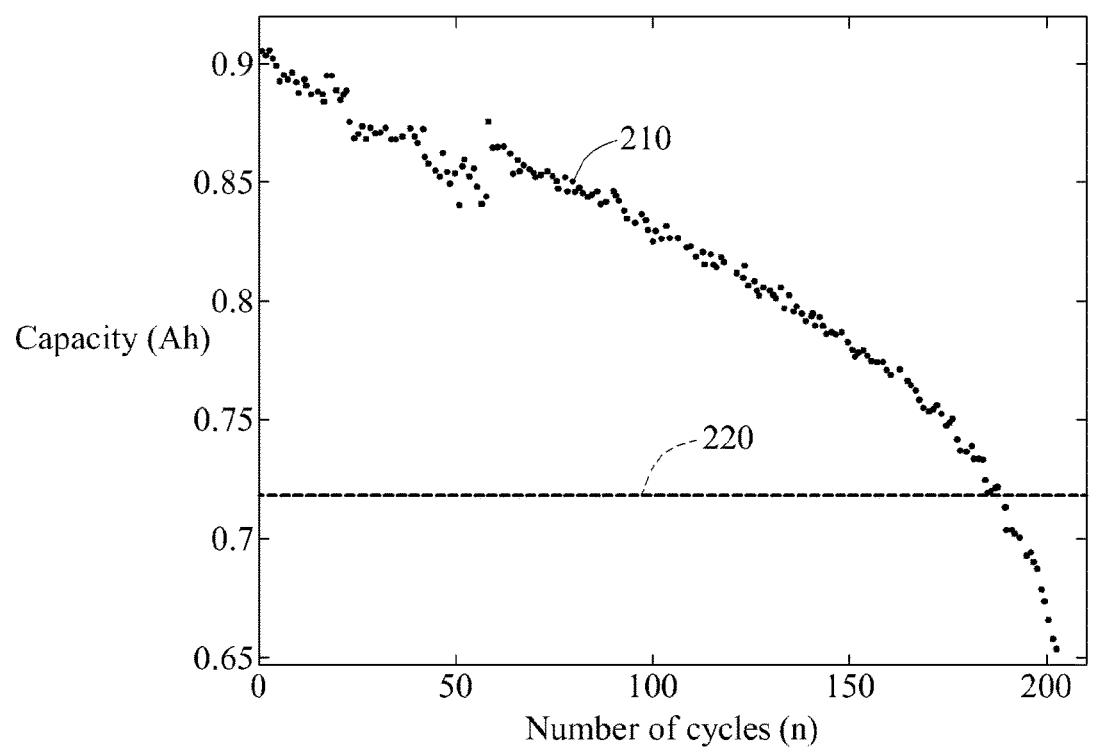
FIG. 2 illustrates an example of a reduction in a life of a battery due to an increase in a number of use cycles of the battery.

FIG. 2 illustrates an example of a reduction in a life of a battery due to an increase in a number of use cycles of the battery.

Referring to FIG. 2, as the number of cycles in which the battery is charged and discharged increases, the life of the battery is reduced. The life of the battery may refer to a period of time during which the battery normally supplies power for an application, for example, for a physical application, such as to one or more motors or systems of an EV. As shown in FIG. 2, the life of the battery may correspond to a capacity 210 of the battery as the number of cycles increases. The capacity 210 at the initial cycle(s) may represent a maximum amount of charge to be stored in the battery. When the capacity 210 is reduced below a threshold 220, for example, the battery may be determined to need to be replaced because the battery does not satisfy a power requirement of the particular physical application. Accordingly, the life of the battery may have a high correlation with a period of time during which the battery is used, or the use cycle of the battery.

Figure 3:
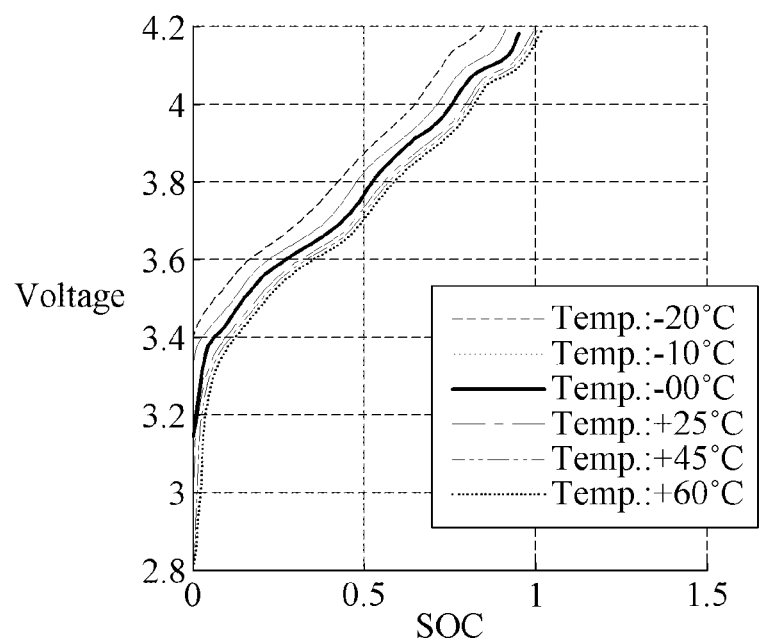
FIG. 3 illustrates example low-rate charging curves for different temperatures.

FIG. 3 illustrates example low-rate charging curves for different temperatures.

The graph of FIG. 3 shows charging curves for different temperatures at a charge rate (C-rate) of 0.01 C. In the graph, the horizontal axis represents a state of charge (SOC) and the vertical axis represents a level of voltage. The C-rate may represent a unit of measure used to set a current value under various use conditions during charging of a battery, and to predict or mark a period of time during which a battery is available. For example, the C-rate may be denoted as C, and may be defined as "(Charge current)/(Battery capacity)." In an example, a C-rate of 1 C may correspond to an amount of charge used to charge a battery for one hour. In the following description, a C-rate of 0.01 C will be considered a low C-rate, that is, a low rate, while a C-rate of 1 C or 0.5 C, for example, will be considered a non-low C-rate. As only an example, a low C-rate may be considered a C-rate that is less than the normal C-rate, e.g., by a factor of 10 or 100, that may be used to charge a battery outside of the intervals when the low C-rate is implemented.

In the graph of FIG. 3, at the low C-rate of 0.01 C, the charging curve has similar patterns regardless of the temperature. Thus, in an embodiment, the low C-rate may be a C-rate where respective charging curves at substantially different temperatures have similar patterns. As only an example of such substantially different temperatures, FIG. 3 illustrates that a charging curve of −20° C. and a charging curve of 60° C. have such similar patterns. Accordingly, the graph indicates that the charging curve for the low C-rate may not be affected by the temperature during low-rate charging.

Figure 4:
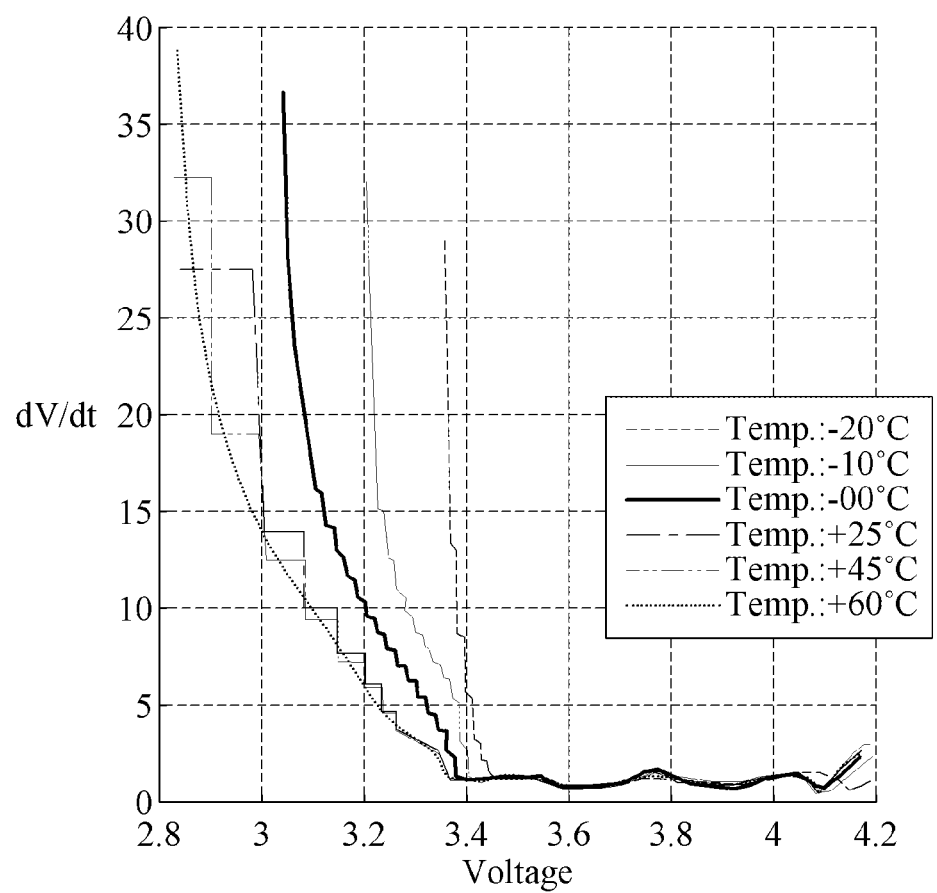
FIG. 4 illustrates example curves of voltage slopes for different temperatures.

FIG. 4 illustrates example curves of voltage slopes for different temperatures.

The graph of FIG. 4 shows relationships between a voltage slope dV/dt and a voltage for different temperatures. In the graph, the horizontal axis represents the voltage and the vertical axis represents the voltage slope. The voltage slopes of FIG. 4 refer to respective variations in the voltage over time in a charging curve based on the different temperatures at a low C-rate of 0.01 C of the graph of FIG. 3.

Thus, in an embodiment, the low C-rate may be a C-rate where the slope of the voltage of a current temperature is similar to a slope of a voltage, over time, of another charging of the battery when using the low C-rate at a substantially different temperature, for an interval of voltage values. For example, in the illustrated interval of 3.5 volts (V) to 4.05 V in FIG. 4, the voltage slopes have similar values regardless of the temperature, which may be caused by a reduction in an effect by an internal resistance of the battery based on low-rate charging, for example. As only an example of such substantially different temperatures, FIG. 4 also illustrates a voltage slope for −20° C. and a voltage slope for 60° C. have similar patterns within the example interval of voltage values.

In the following description, a battery system may include a battery and a battery control apparatus. For example, in an embodiment, the battery control apparatus may refer to a battery management system (BMS).

The battery may supply power to a driving vehicle (for example, an electric vehicle (EV)) including the battery, which may include a plurality of battery modules. Each of the plurality of battery modules may include a plurality of cells. The plurality of battery modules may be connected to each other in parallel, in series, or in both parallel and series. In an example, the plurality of battery modules may be considered secondary batteries, for example, lithium ion batteries. Capacities of the plurality of battery modules may be the same as or different from each other. The battery system may be an energy storage system (ESS).

The battery control apparatus may monitor a state of the battery and may control the battery, e.g., based upon a determined state of health (SOH) of the battery. The SOH may represent a remaining life of the battery. In an example, the battery control apparatus may perform thermal control of the plurality of battery modules in the battery. Additionally, the battery control apparatus may prevent overcharging and over discharging of the battery, and may control the plurality of battery modules to be in equal charge states, as only an example. Accordingly, an energy efficiency of the battery may be increased, and a life of the battery may be extended.

In an embodiment, the battery control apparatus may provide life information, charge information, and function information to an electronic control unit (ECU), e.g., of an EV. The battery control apparatus may communicate with such an ECU using a controller area network (CAN) communication, as only an example.

Figure 5:
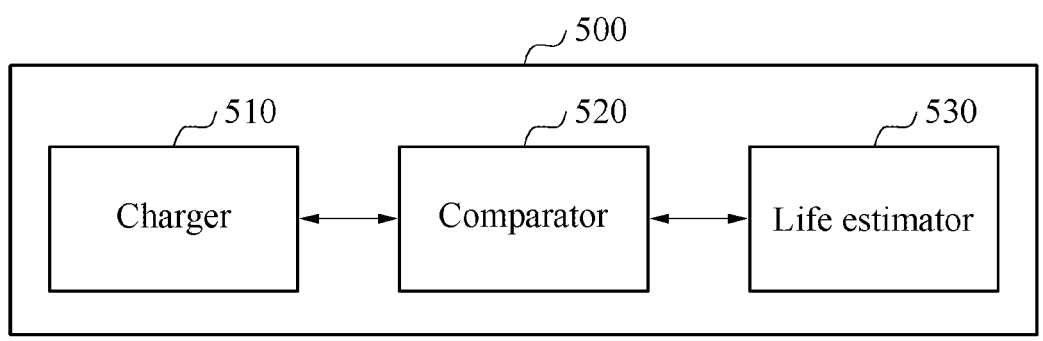
FIG. 5 illustrates an example of a battery life estimation apparatus, according to one or more embodiments.

FIG. 5 illustrates an example of a battery life estimation apparatus, according to one or more embodiments.

Referring to FIG. 5, the battery life estimation apparatus 500 may include a charger 510, a comparator 520, and a life estimator 530, for example.

The battery life estimation apparatus 500 may estimate a state of a battery used as an energy source of an EV, for example. The state of the battery may include a state of health (SOH) and/or an end of life (EOL), as only examples. An exact state information of an EV may be provided to a driver of the EV by more accurately estimating the SOH and the EOL and, accordingly, a drivers may have a more positive opinion about EVs such as they do for gasoline powered vehicles. Additionally, depending on embodiment, the battery life estimation apparatus 500 may be lighter in weight compared to previous estimation systems, and may even be mounted in a battery control apparatus. Furthermore, the battery life estimation apparatus 500 may reduce a time required to estimate a state of a battery compared to previous systems. The battery life estimation apparatus 500 may be applicable to all physical applications employing batteries, in addition to EVs.

During a charging cycle, the charger 510 may charge the battery at a normal C-rate and then at a low C-rate in a low-rate charging interval. Herein, C-rate refers to a rate of a current applied to the battery to charge the battery with respect to a capacity of the battery.

As noted above, the low C-rate refers to a C-rate lower than the normal C-rate that may be primarily used for the full charging cycle. For example, the charger 510 may set the normal C-rate to 0.5 C, and may charge the battery at the normal C-rate for an interval and then a low C-rate, such as 0.01 C, in a low-rate charging interval, and then return to the normal C-rate for another interval. In this example, the intervals that the normal C-rate are applied are longer than the low-rate charging interval. Thus, in one or more embodiments, the low-rate charging interval(s) may only be a minority portion of the full charging cycle, even when a plurality of low-rate charging intervals are provided.

Thus, the charger 510 may selectively apply a current corresponding to the low C-rate to the battery and may charge the battery using the normal C-rate and the low C-rate. For example, when the low C-rate is set to 0.01 C, the charger 510 may be set to apply a current corresponding to $1/100^{th}$ of 1 C to the battery, or in the above example $1/50^{th}$ of the 0.5 C reference C-rate.

Additionally, the charger 510 may charge the battery using different schemes based on a desired or selectable charging mode. The charging mode may be, for example, one of a constant current (CC) charging mode, a constant voltage (CV) charging mode, and a constant power (CP) charging mode. In the CC charging mode, the charger 510 may apply a predetermined amount of a normal current to the battery based on the normal C-rate, and may apply a current lower than the normal current to the battery based on the low C-rate in the low-rate charging interval. In the CV charging mode, the charger 510 may apply a current corresponding to the normal C-rate to the battery to maintain a predetermined amount of a normal voltage, and may change the CV charging mode to the CC charging mode so that a voltage of the battery may become lower than the normal voltage in the low-rate charging interval to charge the battery at the low C-rate. In the CP charging mode, the charger 510 may apply a predetermined amount of normal power to the battery based on the normal C-rate, and may apply low power to the battery based on the low C-rate in the low-rate charging interval.

During a charging cycle, the charger 510 may set or select the low-rate charging interval to occur, e.g., to switch from the application of the normal C-rate during the charging cycle, based on at least one of a range of a voltage used to estimate a life of the battery, the charging mode, a temperature, and a voltage of the battery.

For example, the charger 510 may verify the charging mode of the battery. When the charging mode is the CC charging mode, the charger 510 may set or cause the low-rate charging interval to occur during the charging cycle based on the voltage of the battery. As only an example, in the CC charging mode, the charger 510 may set the low-rate charging interval to occur when the voltage is 3.6 V to 3.65 V. When the charging mode is the CV charging mode, the charger 510 may set or cause the low-rate charging interval to occur during the charging cycle based on a current of the battery. As only an example, in the CV charging mode, the charger 510 may set the low-rate charging interval to occur based on a current interval corresponding to a range of 0.15 C to 0.17 C.

In another example, when the voltage used to estimate the life of the battery ranges from 3.5 V to 4 V, the charger 510 may set a sub-range of 3.7 V to 3.75 V, within the 3.5 V to 4 V range, as the indicator for when the low-rate charging interval should occur.

In still another example, the charger 510 may set the low-rate charging interval to occur based on a voltage measured when a corresponding charging cycle of the battery begins, i.e., when charging of the battery is started. For example, when charging of the battery is started at 3.5 V, the charger 510 may set the low-rate charging interval to occur when the voltage is at least 3.5 V.

The battery life estimation apparatus 500 may initiate such an estimating of the life of the battery, e.g., using such low-rate charging intervals, when a state of the battery satisfies a preset charging condition. When the state of the battery does not satisfy the preset charging condition, the battery life estimation apparatus 500 may not estimate the life of the battery, and the low-rate charging intervals may not be caused to occur during a corresponding charging interval. For example, when the state of the battery satisfies the preset charging condition, the charger 510 may charge the battery at the normal C-rate for a majority of the charging cycle and at the low C-rate during one or more of the low-rate charging intervals. The preset charging condition may include, for example, at least one of a mileage of a driving vehicle including the battery, a number of times the battery is charged, a charging scheme, a temperature, and a voltage of the battery.

For example, the battery life estimation apparatus 500 may estimate the life of the battery every time a mileage of an EV including the battery reaches 1,000 kilometers (km), or every time the battery is charged five times. Additionally, the battery life estimation apparatus 500 may estimate the life of the battery, when charging schemes other than a quick charging scheme of charging the battery at a high speed are used, when the temperature of the battery is equal to or greater than 15° C., or when the voltage of the battery is equal to or less than 2.4 V. Also, the battery life estimation apparatus 500 may estimate the life of the battery when the battery is fully charged.

The comparator 520 compares a change in an electrical physical quantity of the battery over time to a reference curve, e.g., corresponding to a life of the battery in an initial state, using the low-rate charging interval. The electrical physical quantity may be a voltage, however, there is no limitation thereto. The electrical physical quantity may include, for example, a current or power of the battery.

The battery in the initial state may refer to a battery that has not previously been charged and discharged, or a battery after having been mounted in the EV, as only examples. In an embodiment, the reference curve may represent a change in an electrical physical quantity over time when the battery, in the initial state, is charged at a low C-rate, e.g., the reference curve may be based on the battery initially being charged using the low C-rate in a preset interval or using only the low C-rate.

For example, when the battery is charged at the low C-rate, a voltage slope may be determined based on the life of the battery. The voltage slope represents a change in the voltage over time. Accordingly, the comparator 520 may compare the voltage slope of the battery charged at the low C-rate, e.g., during one or more of the low-rate charging intervals, to a voltage slope of the battery in the initial state, and may estimate the life of the battery based on a result of that comparison.

The comparator 520 may include a storage configured to store in advance such a reference curve, and may extract the reference curve from the storage. Additionally, the comparator 520 may generate such a reference curve when the battery is in the initial state, or may receive a reference curve from an external apparatus (for example, a server) using a communication interface. The communication interface may include, for example, a wireless Internet interface, and a local area communication interface. The wireless Internet interface may include, for example, a wireless local area network (WLAN) interface, a wireless fidelity (Wi-Fi) Direct interface, a Digital Living Network Alliance (DLNA) interface, a Wireless Broadband (WiBro) interface, a World Interoperability for Microwave Access (WiMAX) interface, a High Speed Downlink Packet Access (HSDPA) interface, and other interfaces known to one of ordinary skill in the art. The local area communication interface may include, for example, a Bluetooth interface, a radio frequency identification (RFID) interface, an Infrared Data Association (IrDA) interface, a Ultra Wideband (UWB) interface, a ZigBee interface, a near field communication (NFC) interface, and other interfaces known to one of ordinary skill in the art. In addition, the communication interface may include, for example, all interfaces (for example, a wired interface) communicable with the external apparatus. Depending on embodiment, the communication interface may also, or alternatively, be used for alternate communications and sharing of information operations.

The comparator 520 compares the reference curve to a determined change in the electrical physical quantity from a point in time delayed by a preset period of time from a starting point of the low-rate charging interval. For example, using the zoomed in portion of FIG. 8 as an example, when a C-rate at which the charger 510 charges the battery is changed from a normal C-rate to a low C-rate, e.g., at the beginning of the low-rate charging interval 812, the voltage may suddenly drop at the starting point of the low-rate charging interval and may then slowly increase during the low-rate charging interval. Due to an influence by the change in the C-rate, a voltage may irregularly increase during a period of time, e.g., a predetermined period of time, after the voltage suddenly drops at the starting point of the low-rate charging interval. Thus, when this sudden drop and irregular voltage increase influence by the change in the C-rate is mitigated or has passed, the voltage may regularly increases in the remainder of the low-rate charging interval. Accordingly, to increase an accuracy of calculating the voltage slope, the comparator 520 may calculate the voltage slope during the low-rate charging interval from the point in time delayed by the preset period of time from the starting point of the low-rate charging interval. Again, using FIG. 8 as only an example, this sub-interval, within the low-rate charging interval, when the voltage slope is calculated or measured may be represented by the sub-interval 821 of the low-rate charging interval 812.

The charger 510 may set a plurality of low-rate charging intervals to occur based on at least one of a range of a voltage used to estimate the life of the battery, the charging mode, a temperature, and a voltage of the battery. The comparator 520 may compare the reference curve to a calculated average change in the electrical physical quantity over time in each of the plurality of low-rate charging intervals. For example, as explained above, the comparator 520 may measure a voltage slope from a point in time delayed by a preset period of time from a starting point of each of the plurality of low-rate charging intervals, in each of the plurality of low-rate charging intervals, and may calculate an average slope indicating an average of voltage slopes respectively measured in the plurality of low-rate charging intervals. The comparator 520 may compare the average slope to the reference curve.

In an embodiment, the comparator 520 may extract a measure of central tendency of the reference curve and a measure of central tendency of the electrical physical quantity over time in each of the plurality of low-rate charging intervals, and may compare the extracted measures of central tendency. The measure of central tendency refers to a representative value of a change in an electrical physical quantity of a battery over time, or a representative value of a reference curve. The measure of central tendency may include, as only an example, an arithmetic mean, a weighted mean, a median, or a mode. For example, when three low-rate charging intervals are provided during a charging cycle, the comparator 520 may compare a median of a voltage slope in each of the three low-rate charging intervals to a median of a reference curve.

As noted above, the comparator 520 may generate the reference curve. For example, the comparator 520 may determine whether the battery is in an initial state. When the battery is determined to be in the initial state, the comparator 520 may generate a reference curve based on the battery in the initial state. For example, the charger 510 may charge the battery in the initial state at the low C-rate in a preset charging interval. The preset charging interval may be, for example, an entire charging cycle or a preset voltage interval portion of the entire charging cycle. For example, the comparator 520 may determine whether the battery is to be charged at the low C-rate for the entire charging cycle or only in a voltage interval portion, set in advance, of the entire charging cycle, based on at least one of a range of a voltage used to estimate the life of the battery, the charging mode, the temperature, and the voltage of the battery. The low-rate charging interval in which the battery is charged at the low C-rate may be included in a preset charging interval of the battery in the initial state. The preset charging interval may represent the entire charging cycle or only a portion of the entire charging cycle.

When the charger 510 charges the battery in the initial state at the low C-rate in the preset charging interval, the comparator 520 may calculate a change in an electrical physical quantity of the battery in the initial state over time during the preset charging interval, and may generate a reference curve. In an example, the comparator 520 may measure a change in a voltage or a voltage slope of the battery in the initial state in the preset charging interval and may generate a reference curve. In another example, the charger 510 may charge the battery in the initial state at a C-rate of 0.1 C in the preset charging interval, and the comparator 520 may measure a change in the voltage of the battery in the initial state in the preset charging interval and may generate a reference curve. In this example, the comparator 520 may correct or interpolate the measured change that is based on the C-rate of 0.1 C, may estimate a change in the voltage of the battery in the initial state during charging of the battery in the initial state at a C-rate of 0.01 C based on a preset charging curve, and may generate a reference curve based on the estimated change.

The life estimator 530 may estimate the life of the battery based on the comparison output of the comparator 520. For example, the life estimator 530 may estimate the life of the battery based on a result obtained, e.g., by the comparator 520, by comparing the reference curve to the change in the electrical physical quantity of the battery over time. In an example, when a voltage slope in the low-rate charging interval is $n_1$ and a voltage slope of the reference curve is $n_2$, the life estimator 530 may estimate the life of the battery to be $n_2/n_1$ times a previously determined life of the battery in the initial state. In another example, the life estimator 530 may include a lookup table including information on a correlation between the life of the battery in the initial state and a ratio of the voltage slope in the low-rate charging interval to the voltage slope of the reference curve. In this example, the life estimator 530 may extract the life of the battery from the lookup table based on the ratio of the voltage slope in the low-rate charging interval to the voltage slope of the reference curve.

As described above with reference to FIGS. 3 and 4, the voltage slope in the low-rate charging interval may not be affected by the temperature. The life estimator 530 may estimate the life of the battery based on the voltage slope in the low-rate charging interval to the voltage slope of the reference curve and accordingly, the life of the battery estimated by the life estimator 530 may have a high accuracy regardless of the temperature.

Figure 6:
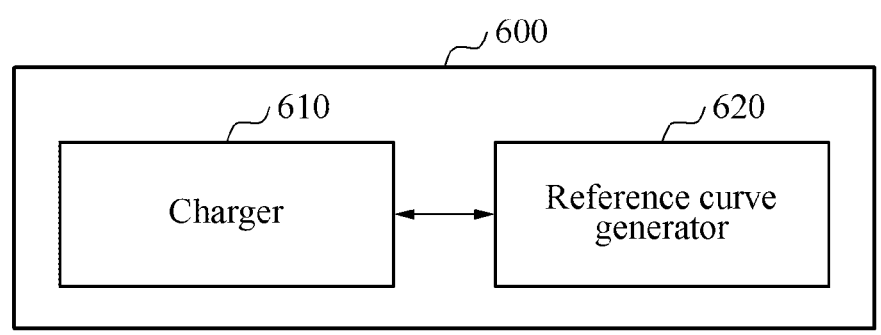
FIG. 6 illustrates an example of a battery life estimation apparatus, according to one or more embodiments.

FIG. 6 illustrates an example of a battery life estimation apparatus, according to one or more embodiments.

Referring to FIG. 6, the battery life estimation apparatus 600 includes a charger 610 and a reference curve generator 620, for example.

The charger 610 may charge a battery in an initial state at a low C-rate in a preset charging interval. The preset charging interval may be, for example, an entire charging cycle or a preset voltage interval portion of the entire charging cycle. As only an example, the entire charging cycle may refer to an entire interval in which a battery in a fully discharged or initial state is fully charged. For example, the charger 610 may charge the battery in the initial state at the low C-rate for the entire charging cycle, or may charge the battery in the initial state at the low C-rate only in a voltage interval of 3 V to 3.5 V, as only an example. An interval in which the battery in the initial state is charged at the low C-rate may be selected using an external apparatus or by the charger 610. For example, the charger 610 may select the interval in which the battery in the initial state is charged, based on at least one of a range of a voltage used to estimate a life of the battery, a charging mode, a temperature, and a voltage of the battery in the initial state.

The charger 610 may charge the battery in the initial state using different schemes based on the charging mode. For example, the charger 610 may charge the battery in the initial state using a scheme corresponding to each of a CC charging mode, a CV charging mode, and a CP charging mode.

The reference curve generator 620 may calculate a change in an electrical physical quantity of the battery in the initial state over time in the preset charging interval, and generate a reference curve used to estimate the life of the battery based on charging and discharging of the battery.

In an example, the reference curve generator 620 may measure a change in a voltage or a voltage slope of the battery in the initial state in the preset charging interval, and may generate a reference curve. In this example, the reference curve generator 620 may measure a value of the voltage of the battery in the initial state in an interval in which the battery is charged at the low C-rate, and may generate the reference curve based on the measured value.

In another example, the charger 610 may charge the battery in the initial state at a C-rate of 0.1 C in the preset charging interval, and the reference curve generator 620 may measure a change in a voltage of the battery in the initial state in the preset charging interval and may generate a reference curve. In this example, the reference curve generator 620 may correct or interpolate the measured change that is based on the C-rate of 0.1 C, may estimate a change in the voltage of the battery in the initial state during charging of the battery in the initial state at a C-rate of 0.01 C based on a preset charging curve, and may generate the reference curve based on the estimated change.

The battery life estimation apparatus 600 may include a storage memory. The battery life estimation apparatus 600 may store the reference curve generated by the reference curve generator 620 in such a storage memory. In an embodiment, the battery life estimation apparatus 600 may transmit the generated reference curve to an external apparatus using a communication interface.

Figure 7:
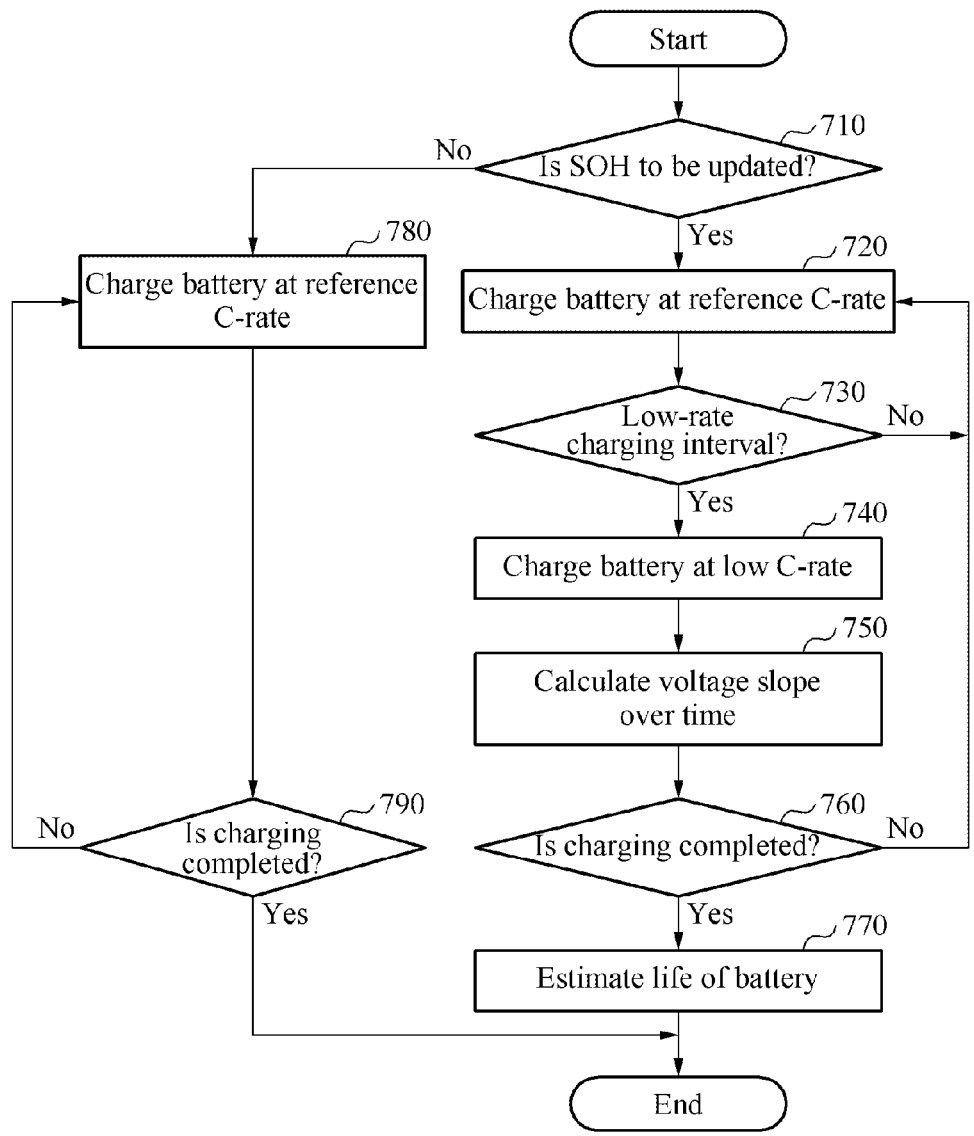
FIG. 7 illustrates an example of a battery life estimation method, according to one or more embodiments.

FIG. 7 illustrates an example of a battery/life estimation method, according to one or more embodiments.

Referring to FIG. 7, in operation 710, a determination may be made as to whether an SOH, or remaining life, of a battery is to be determined or updated. As only an example, the battery life estimation apparatuses of FIG. 5 or 6 may determine whether the SOH is to be updated, e.g., by using the aforementioned low C-rate charging interval, based on whether a state of the battery satisfies a preset condition. Briefly, the below operations of FIGS. 7-13 and 16-17 may be explained through references to such battery estimation apparatuses, but should not be limited to the same. The preset condition may include, for example, at least one of a mileage of a driving vehicle including the battery, a number of times the battery is charged, a charging scheme, a temperature, and a voltage of the battery. For example, when a mileage of an example EV including the battery reaches 500 km, every time the battery is charged five times, or when the temperature of the battery is equal to or higher than 15° C., the battery life estimation apparatus may update the SOH. When charging schemes other than a quick charging scheme of charging the battery at a high speed are used, or when the voltage is equal to or lower than 2.4 V, the battery life estimation apparatus may also update the SOH.

When it is determined that the SOH is to be updated, the battery life estimation apparatus may first charge the battery at a normal C-rate in operation 720. The normal C-rate refers to a C-rate that may be applied for a full charging cycle when the SOH is not being updated, and may be applied for a majority of the charging cycle when the SOH is being updated. For example, the battery life estimation apparatus may set the normal C-rate to 0.5 C, and may charge the battery at the set normal C-rate.

In operation 730, the battery life estimation apparatus determines whether a charging interval of the battery should be a low-rate charging interval, e.g., whether the C-rate should be changed to the low C-rate from the normal C-rate, by monitoring the battery charged at the normal C-rate. In an example, when the low-rate charging interval is set as an interval of 3.5 V to 4 V, as only an example, the battery life estimation apparatus may determine whether the voltage is included in the interval of 3.5 V to 4 V. When the voltage is not included in the interval of 3.5 V to 4 V, the battery life estimation apparatus may determine that the charging interval is not the low-rate charging interval and the C-rate may be maintained at the normal C-rate. When the voltage is included in the interval of 3.5 V to 4 V, the battery life estimation apparatus may determine that the charging interval is the low-rate charging interval and the C-rate may be changed to the low C-rate.

In another example, when the low-rate charging interval is set as a period of five minutes elapsed from a point in time at which the voltage reaches 3 V, the battery life estimation apparatus may determine whether the voltage reaches 3 V. When the voltage is determined to reach 3 V, the battery life estimation apparatus may determine that the charging interval is the low-rate charging interval and the C-rate may be changed to the low C-rate.

For example, a plurality of low-rate charging intervals may be provided. When an interval of 3 V to 3.3 V and an interval of 3.7 V to 4 V are set as low-rate charging intervals, the battery life estimation apparatus may determine whether the charging interval is the low-rate charging interval by determining whether the voltage is included in either of the two example intervals.

When it is determined that the charging interval is not the low-rate charging interval, the battery life estimation apparatus charges (or continues to charge) the battery at the normal C-rate in operation 720. When it is determined that the charging interval is the low-rate charging interval, the battery life estimation apparatus charges the battery at the low C-rate in operation 740 by changing the C-rate to the low C-rate.

In operation 750, the battery life estimation apparatus calculates a voltage slope of the battery over time in the low-rate charging interval. As noted above, to increase an accuracy of calculating the voltage slope, the battery life estimation apparatus may calculate the voltage slope in the low-rate charging interval from a point in time delayed by a preset period of time from a starting point of the low-rate charging interval. When a plurality of low-rate charging intervals are provided, the battery life estimation apparatus may measure a voltage slope from a point in time delayed by a preset period of time from a starting point of each of the plurality of low-rate charging intervals, and may calculate an average, for example, slope indicating an average of voltage slopes measured in the plurality of low-rate charging intervals.

In operation 760, the battery life estimation apparatus determines whether charging of the battery is completed. The battery life estimation apparatus may detect the voltage of the battery, and may determine whether the detected voltage is a voltage measured when the battery is fully charged. For example, when the voltage of the battery is equal to or higher than 4.2 V, the battery life estimation apparatus may determine that the charging of the battery is completed. When the charging is determined to not be completed, the battery life estimation apparatus may return to charging the battery at the normal C-rate in operation 720.

In an embodiment, when the charging is determined to be completed, the battery life estimation apparatus may estimate a life of the battery in operation 770. The battery life estimation apparatus may compare a reference curve to the voltage slope over time and may estimate the life of the battery based on a result of the comparing.

When it is determined that the SOH is not to be updated in operation 710, the battery life estimation apparatus may charge the battery at the normal C-rate, e.g., for the full charging cycle, in operation 780.

In operation 790, the battery life estimation apparatus may determine whether the charging of the battery is completed. When the charging is determined to not be completed, the battery life estimation apparatus may return/continue to charge the battery at the normal C-rate in operation 780. When the charging is determined to be completed, the battery life estimation apparatus terminates the charging.

Figure 8:
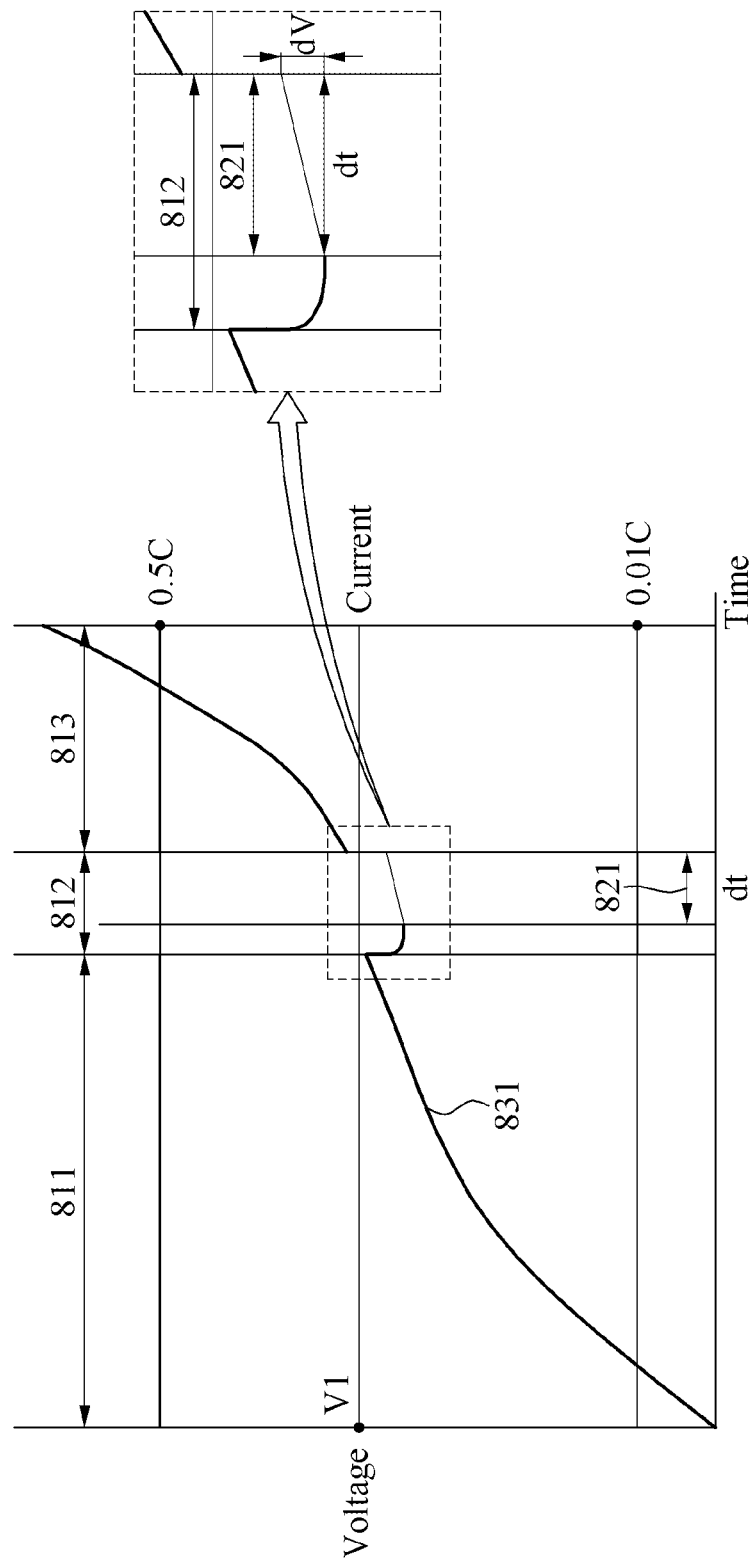
FIGS. 8 and 9 illustrate examples of a low-rate charging curve in a constant current (CC) charging mode, according to one or more embodiments.
Figure 9:
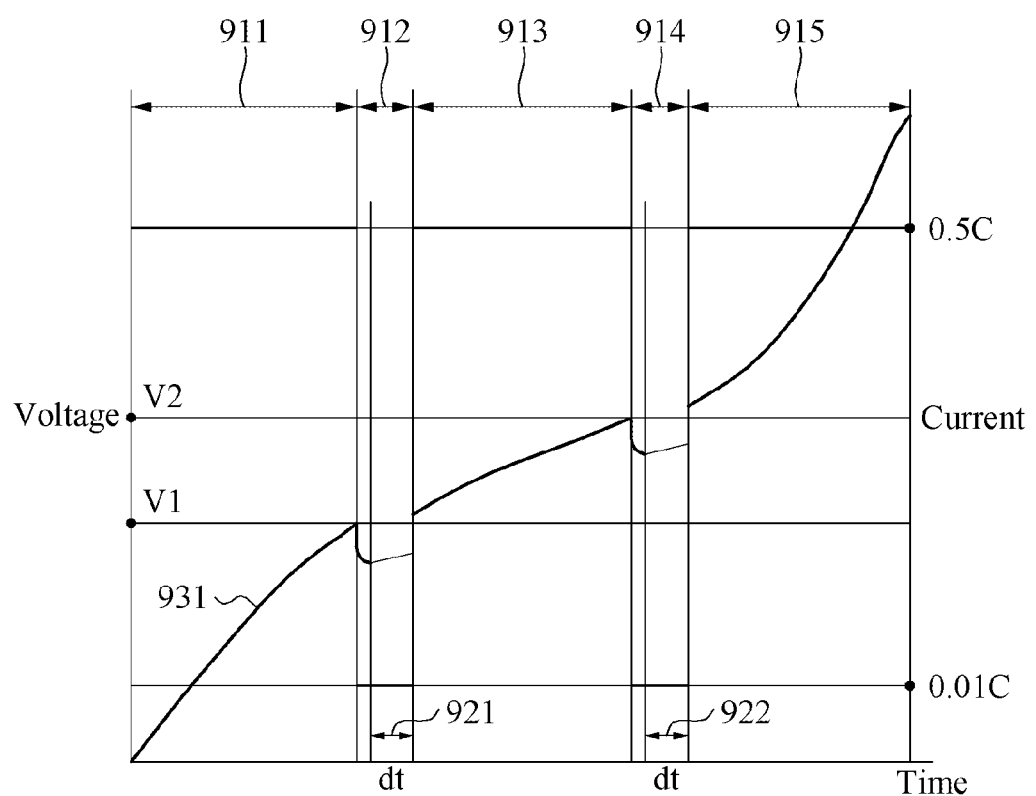

FIGS. 8 and 9 illustrate examples of a low-rate charging curve in a CC charging mode, according to one or more embodiments.

Referring to FIG. 8, the left graph shows a voltage slope of a battery over time in the CC charging mode, and the right graph shows a zoomed-in view of a time interval 812 of the left graph. In the left graph and the right graph, the horizontal axis represents time and the vertical axis represents a voltage, a current, and a C-rate.

A battery life estimation apparatus may charge the battery at a normal C-rate. In an example of FIG. 8, the normal C-rate is set to 0.5 C. During a time interval 811, the battery life estimation apparatus charges the battery at the normal C-rate and accordingly, a voltage 831 of the battery increases.

Additionally, the battery life estimation apparatus may monitor the battery charged at the normal C-rate, and determine whether the charging interval of the battery should be a low-rate charging interval. For example, the low-rate charging interval may be a preset period of time elapsed after the voltage 831 reaches a voltage V1. In this example, the battery life estimation apparatus may set the time interval 812 to be the low-rate charging interval, and may charge the battery at a low C-rate during the time interval 812.

Thus, here, the battery life estimation apparatus may charge the battery at a low C-rate of 0.01 C during the time interval 812. To reduce the C-rate, the battery life estimation apparatus may reduce a current so that the current may correspond to the C-rate of 0.01 C. As discussed above, when the C-rate is reduced from the normal C-rate of 0.5 C to the low C-rate of 0.01 C, the voltage 831 may suddenly drop at a starting point of the time interval 812, and may irregularly increase during a period of time, e.g., a predetermined period of time. When such an influence by the change in the C-rate is mitigated or has passed, the voltage 831 may then regularly increase during the time interval 821, e.g., for the remainder of the time interval 812. To increase an accuracy of calculating the voltage slope, the battery life estimation apparatus may calculate the voltage slope in the time interval 821, that is, after the influence by the change in the C-rate has been mitigated or passed.

When the time interval 821 ends, the battery life estimation apparatus may return the C-rate to 0.5 C and charge the battery in a time interval 813. To increase the C-rate from the low C-rate, the battery life estimation apparatus may increase the current so that the current may correspond to 0.5 C. When the C-rate increases from the low C-rate of 0.01 C to the normal C-rate of 0.5 C, the voltage 831 may increase in the time interval 813. When the battery is fully charged, the battery life estimation apparatus may terminate the charging of the battery.

Referring to FIG. 9, a graph shows a voltage slope of a battery over time in the CC charging mode. In the graph of FIG. 9, the horizontal axis represents time and a vertical axis represents a voltage, a current, and a C-rate.

A battery life estimation apparatus may charge the battery at a normal C-rate. In an example of FIG. 9, the reference C-rate may be set to 0.5 C. In time intervals 911, 913 and 915, the battery life estimation apparatus may charge the battery using the normal C-rate and accordingly, a voltage 931 of the battery increases over time.

The battery life estimation apparatus may monitor the battery being charged at the normal C-rate, and may determine whether a charging interval of the battery should be a low-rate charging interval. For example, respective low-rate charging intervals may be a preset period of time elapsed after the voltage 931 reaches a voltage V1, and a preset period of time elapsed after the voltage 931 reaches a voltage V2. In this example, the battery life estimation apparatus may set time intervals 912 and 914 to be low-rate charging intervals, and may charge the battery using a low C-rate during the time intervals 912 and 914. For example, the battery life estimation apparatus may charge the battery at a low C-rate of 0.01 C during the time intervals 912 and 914.

Additionally, the battery life estimation apparatus may calculate a voltage slope in each of the time intervals 912 and 914. To increase an accuracy of calculating the voltage slope, the battery life estimation apparatus may calculate respective voltage slopes in each of time intervals 921 and 922, that is, after an influence by the change in the C-rate from the normal C-rate to the low C-rate has mitigated or passed. Also, the battery life estimation apparatus may calculate a measure of central tendency of each of a voltage slope in the time interval 921 and a voltage slope in the time interval 922, and may estimate a life of the battery based on the calculated measures of central tendency.

When the battery is determined to be fully charged, e.g., in the time interval 915, the battery life estimation apparatus may terminate the charging of the battery.

Figure 10:
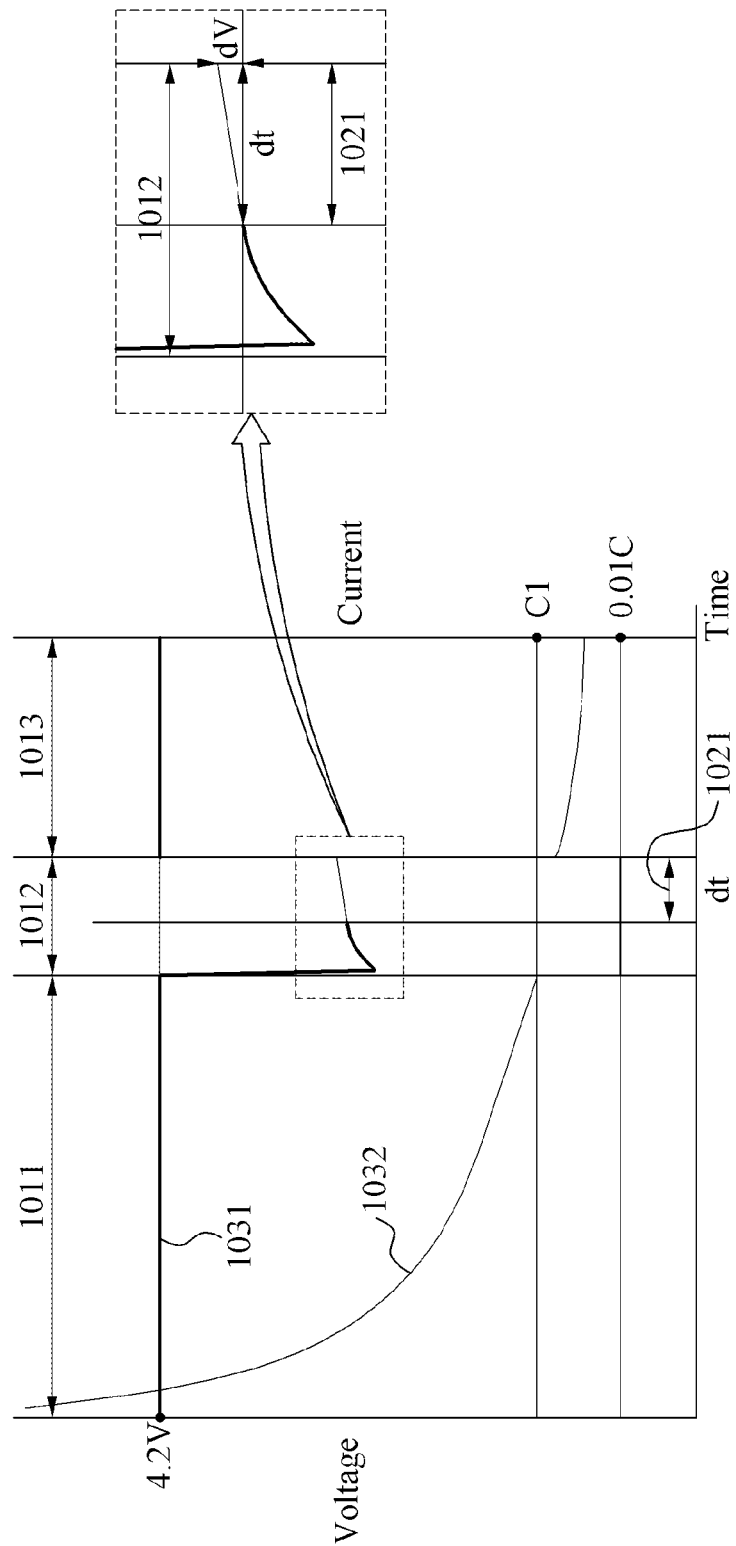
FIGS. 10 and 11 illustrate examples of a low-rate charging curve in a constant voltage (CV) charging mode, according to one or more embodiments.
Figure 11:
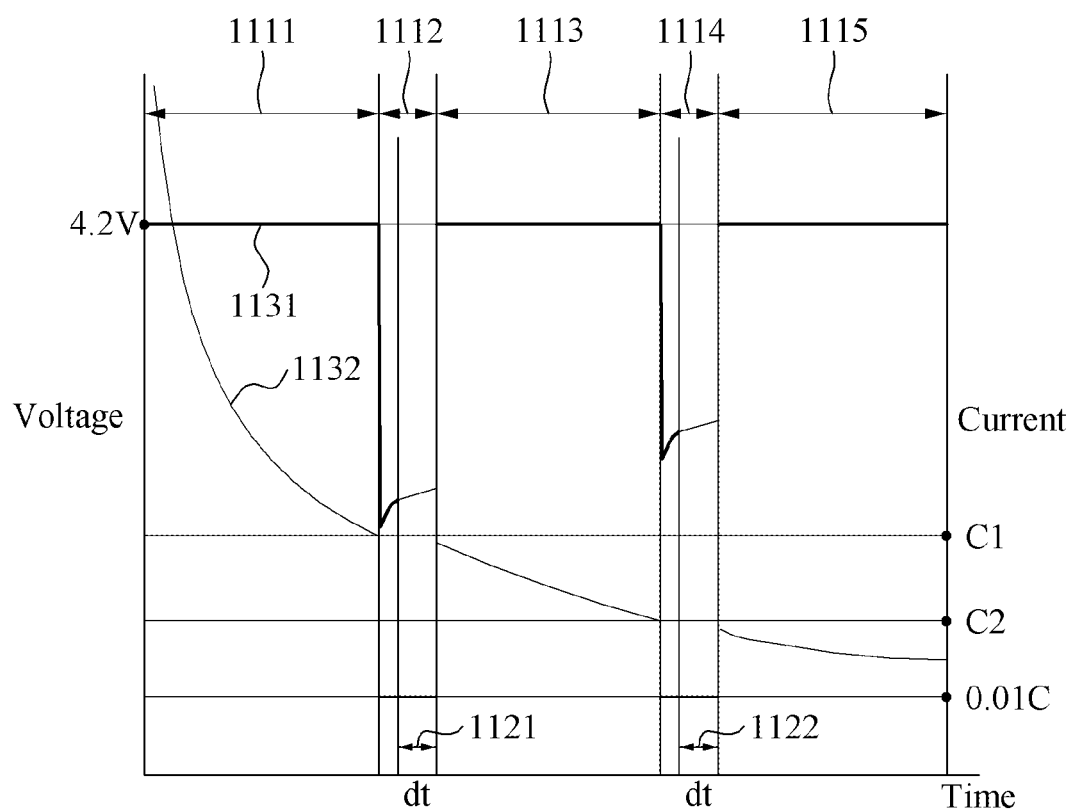

FIGS. 10 and 11 illustrate examples of a low-rate charging curve in a CV charging mode, according to one or more embodiments.

Referring to FIG. 10, the left graph shows a voltage slope of a battery over time in the CV charging mode, and the right graph shows a zoomed-in view of a time interval 1012 of the left graph. In the left graph and the right graph, the horizontal axis represents time and the vertical axis represents a voltage, a current, and a C-rate.

A battery life estimation apparatus may charge the battery at a normal constant voltage (CV). In an example of FIG. 10, the normal CV is set to 4.2 V. In a time interval 1011, the battery life estimation apparatus may charge the battery at the normal CV and accordingly, a current 1032 of the battery decreases.

The battery life estimation apparatus may monitor the battery charged at the normal CV, and determine whether a charging interval of the battery should be a low-rate charging interval. For example, the low-rate charging interval may be a preset period of time elapsed after the current 1032 reaches a current C1. In this example, the battery life estimation apparatus may set the time interval 1012 to be the low-rate charging interval, and may perform constant current (CC) charging of the battery at a low C-rate during the time interval 1012.

For example, the battery life estimation apparatus may change the charging mode from the CV charging mode to the CC charging mode for the time interval 1012, and charge the battery at a low C-rate of 0.01 C during the time interval 1012. When the CV charging mode is changed to the example low C-rate CC charging mode, a voltage 1031 of the battery rapidly changes during the time interval 1012 and then may irregularly increase for a period of time, e.g., a predetermined period of time.

When such an influence by the change in the charging mode from the CV charging mode to the low C-rate CC charging mode has mitigated or passes, the voltage 1031 may regularly increase during the time interval 1021, e.g., for the remainder of the time interval 1012. To increase an accuracy of calculating the voltage slope, the battery life estimation apparatus may calculate the voltage slope in the time interval 1021, that is, after the influence by the change in the charging mode from the CV charging mode to the low C-rate CC charging mode has been mitigated or passed.

When the time interval 1021 ends, the battery life estimation apparatus may return to charging the battery in the CV charging mode at the normal CV in a time interval 1013. When the battery is determined to be fully charged, the battery life estimation apparatus may terminate the charging of the battery.

Referring to FIG. 11, a graph shows a voltage slope of a battery over time in the CV charging mode. In the graph, the horizontal axis represents time and the vertical axis represents a voltage, a current, and a C-rate.

A battery life estimation apparatus may charge the battery at a normal CV. In an example of FIG. 11, the reference CV may be set to 4.2 V. In time intervals 1111, 1113, and 1115, the battery life estimation apparatus may charge the battery in the CV charging mode at the normal CV and accordingly, a current 1132 of the battery decreases.

The battery life estimation apparatus may monitor the battery being charged in a CV charging mode at the normal CV, and determine whether a charging interval of the battery should be a low-rate charging interval. For example, respective low-rate charging intervals may be set as a preset period of time elapsed after the current 1132 reaches a current C1 and a preset period of time elapsed after the current 1132 reaches a current C2. In this example, the battery life estimation apparatus may set time intervals 1112 and 1114 to be low-rate charging intervals, and may charge the battery in a CC charging mode using a low C-rate in the time intervals 1112 and 1114. For example, the battery life estimation apparatus may change the charging mode from the CV charging mode to the CC charging mode for the time intervals 1112 and 1114, and may charge the battery at a low C-rate of 0.01 C in the CC charging mode for the time intervals 1112 and 1114. When the charging mode is changed from the CV charging mode to a low C-rate CC charging, a voltage 1131 of the battery rapidly changes, and may irregularly increase during a period of time, e.g., a predetermined period of time. Additionally, the battery life estimation apparatus may calculate a voltage slope in each of the time intervals 1112 and 1114. To increase an accuracy of calculating the voltage slope, the battery life estimation apparatus may calculate a voltage slope in each of time intervals 1121 and 1122, that is, after an influence by the change in the charging mode from the CV charging mode to the CC charging mode has been mitigated or passes. The battery life estimation apparatus may also calculate a measure of central tendency of a voltage slope in the time interval 1121 and a measure of central tendency of a voltage slope in the time interval 1122, and may estimate a life of the battery based on the calculated measures of central tendency.

When the battery is determined to be fully charged in the time interval 1115, the battery life estimation apparatus may terminate the charging of the battery.

Figure 12:
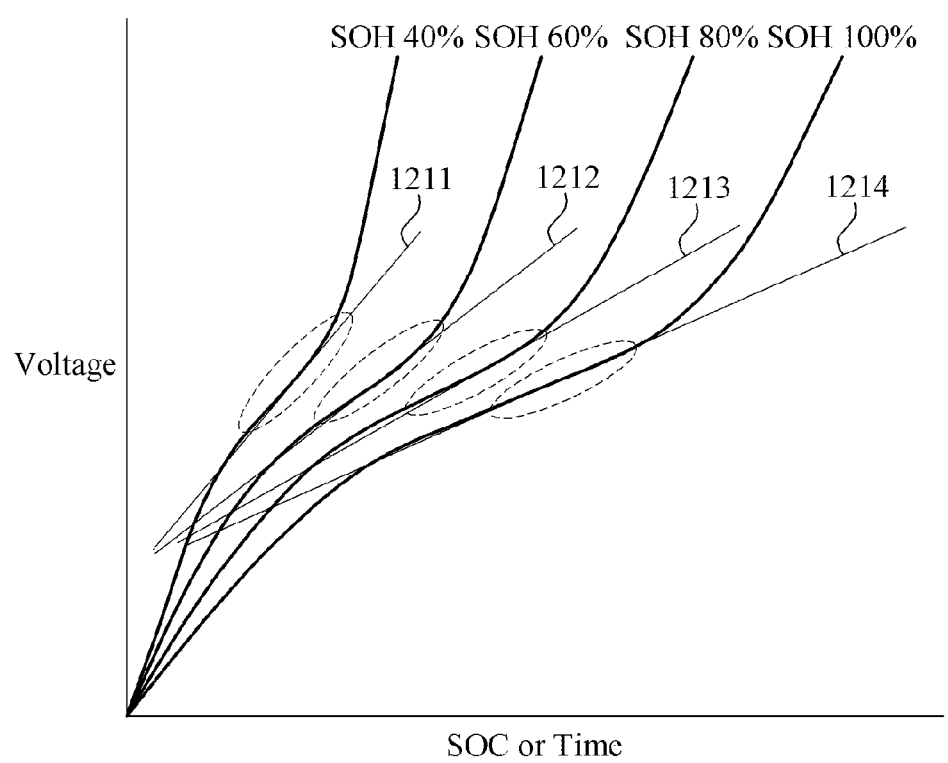
FIGS. 12 and 13 illustrate examples of calculation of a voltage slope in a low-rate charging interval, according to one or more embodiments.
Figure 13:
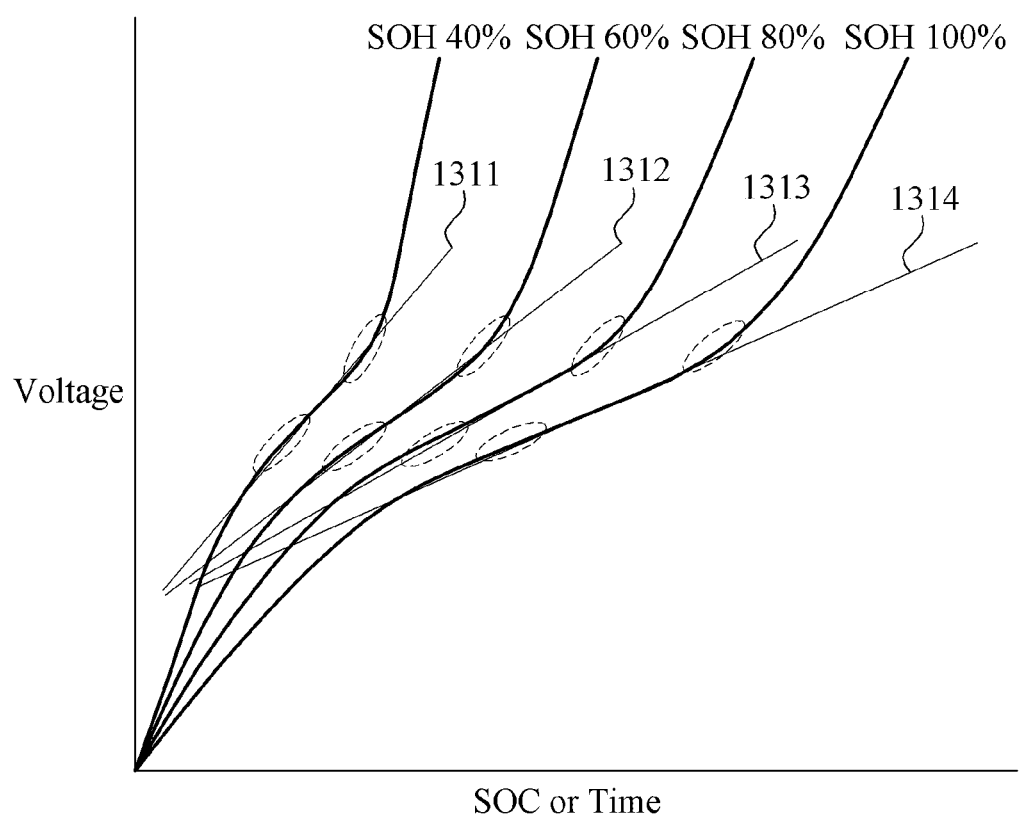

FIGS. 12 and 13 illustrate examples of calculation of a voltage slope in a low-rate charging interval, according to one or more embodiments.

Referring to FIG. 12, the graph shows a change in a voltage of a battery over time based on a life of the battery during charging of the battery. In the graph of FIG. 12, the horizontal axis represents time or an SOC and the vertical axis represents the voltage.

A battery life estimation apparatus may charge the battery at a normal C-rate (for example, 0.5 C), and then charge the battery at a low C-rate (for example, 0.01 C) in a low-rate charging interval. The battery life estimation apparatus may calculates voltage slopes 1211 through 1214 in low-rate charging intervals respectively for different SOH's. The voltage slopes 1211 through 1214 vary based on the life of the battery. In FIG. 12, the voltage slope 1211 corresponding to an SOH of 40% is greater than the voltage slope 1214 corresponding to an SOH of 100%. The battery life estimation apparatus may compare the voltage slopes 1211 through 1213 to the voltage slope 1214 and estimates the life of the battery.

Referring to FIG. 13, the graph shows a change in a voltage of a battery over time based on a life of the battery during charging of the battery. In the graph, the horizontal axis represents time or an SOC and the vertical axis represents the voltage.

A battery life estimation apparatus may charge the battery at a normal C-rate (for example, 0.5 C), and then charge the battery at a low C-rate (for example, 0.01 C) in two low-rate charging intervals.

The battery life estimation apparatus calculates voltage slopes 1311 through 1314, using the two low-rate charging intervals, respectively for different SOH's. The battery life estimation apparatus may calculate a voltage slope in each of the two low-rate charging intervals, for each of the SOH's, and calculate a measure of central tendency of the voltage slope in each of the two low-rate charging intervals. For example, the battery life estimation apparatus may calculate an arithmetic mean of voltage slopes in each of the two low-rate charging intervals.

The battery life estimation apparatus may then compare a measure of central tendency of each of the voltage slopes 1311 through 1313 to a measure of central tendency of the voltage slope 1314, and estimate the life of the battery.

Figure 14:
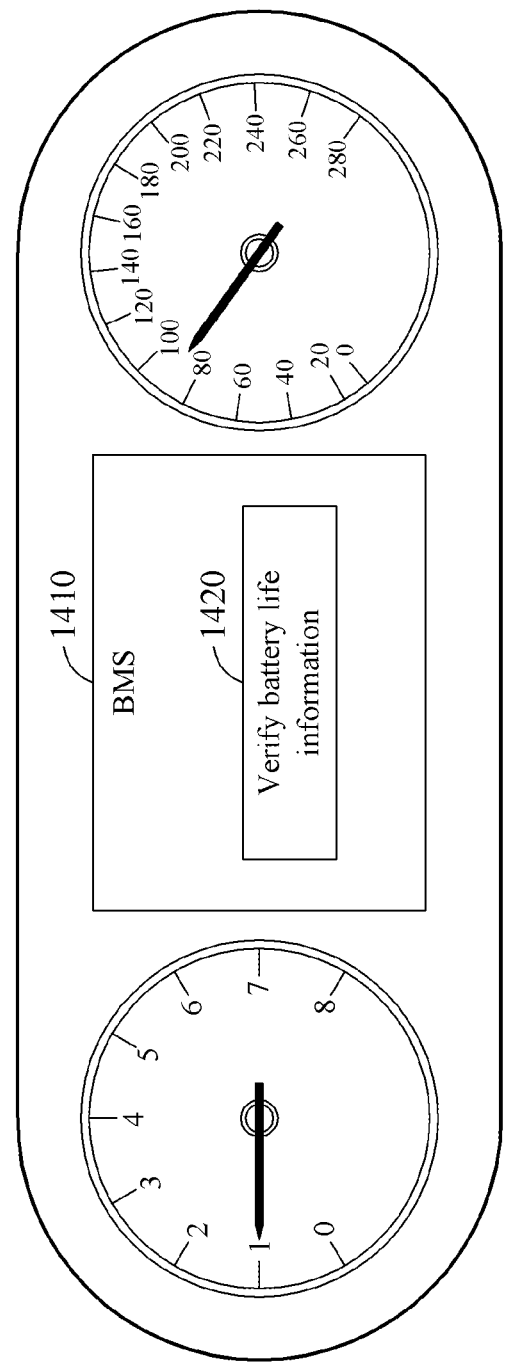
FIG. 14 illustrates an example of a user interface, according to one or more embodiments.

FIG. 14 illustrates an example of a user interface, according to one or more embodiments.

Referring to FIG. 14, as only an example, a battery control apparatus, such as the battery control apparatuses of FIGS. 5 and 6, may receive a trigger signal from an external apparatus, and estimate a life of a battery in response to a reception of the trigger signal. Accordingly, the battery control apparatus may estimate the life of the battery in real time. For example, when an ignition of an EV including the battery and the battery control apparatus is turned on, an ECU of the EV may display a user interface 1410 on a dashboard illustrated in FIG. 14. The user interface 1410 may include an interface 1420 configured to generate a trigger signal. When a user selects the interface 1420, for example, the ECU may transmit a trigger signal to the battery control apparatus. The battery control apparatus may then charge the battery selectively using a low-rate charging interval, where a low C-rate is applied, and compare a change in an electrical physical quantity of the battery over time for the low-rate charging interval to a reference curve corresponding to a life of the battery in an initial state. Additionally, the battery control apparatus may estimate the life of the battery based on an output of a comparator that performs the comparing of the change in the electrical physical quantity of the battery over time for the low-rate charging interval to the reference curve.

The battery control apparatus may transmit the estimated life of the battery to the ECU. The ECU may display the life of the battery received from the battery control apparatus.

Figure 15:
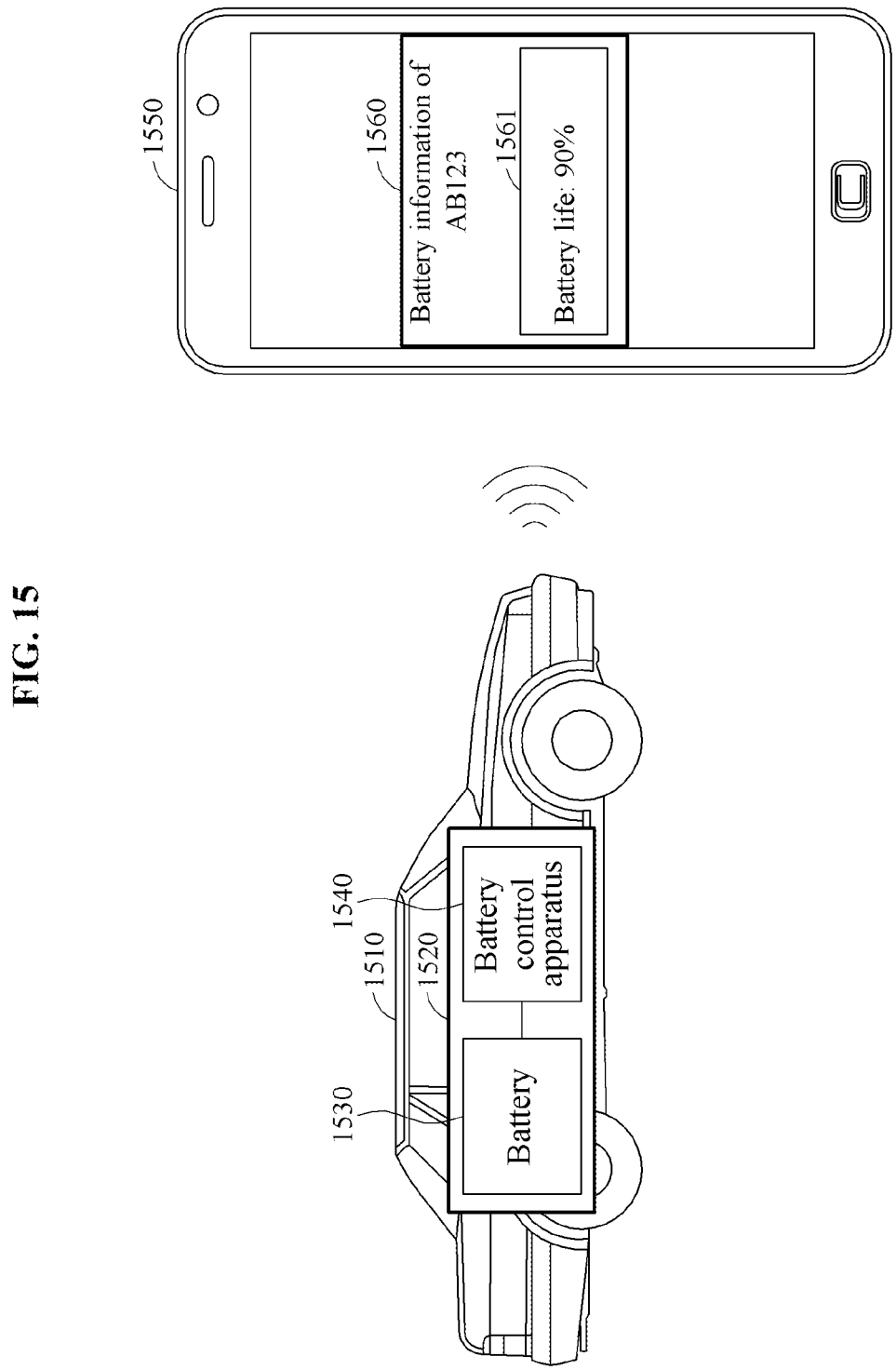
FIG. 15 illustrates an example of a user interface to provide battery life information, according to one or more embodiments.

FIG. 15 illustrates an example of a user interface to provide battery life information, according to one or more embodiments.

Referring to FIG. 15, in one or more embodiments, an EV 1510 may include a battery system 1520. The battery system 1520 may include a battery 1530 and a battery control apparatus 1540, for example. The battery control apparatus 1540 may extract a life of the battery 1530, and transmit the life of the battery 1530 to a terminal 1550 using a wireless interface, for example. The battery control apparatus may operate similarly to the previous discussed battery control apparatuses of FIGS. 5, 6, and 14, and operations of FIGS. 7-13, for example.

In an example, the battery control apparatus 1540 may receive a trigger signal from the terminal 1550 via the wireless interface, and may estimate the life of the battery 1530 in response to a reception of the trigger signal. The battery control apparatus 1540 may transmit the estimated life to the terminal 1550 using the wireless interface. The terminal 1550 may display a life 1561 of the battery 1530 using a user interface 1560.

Figure 16:
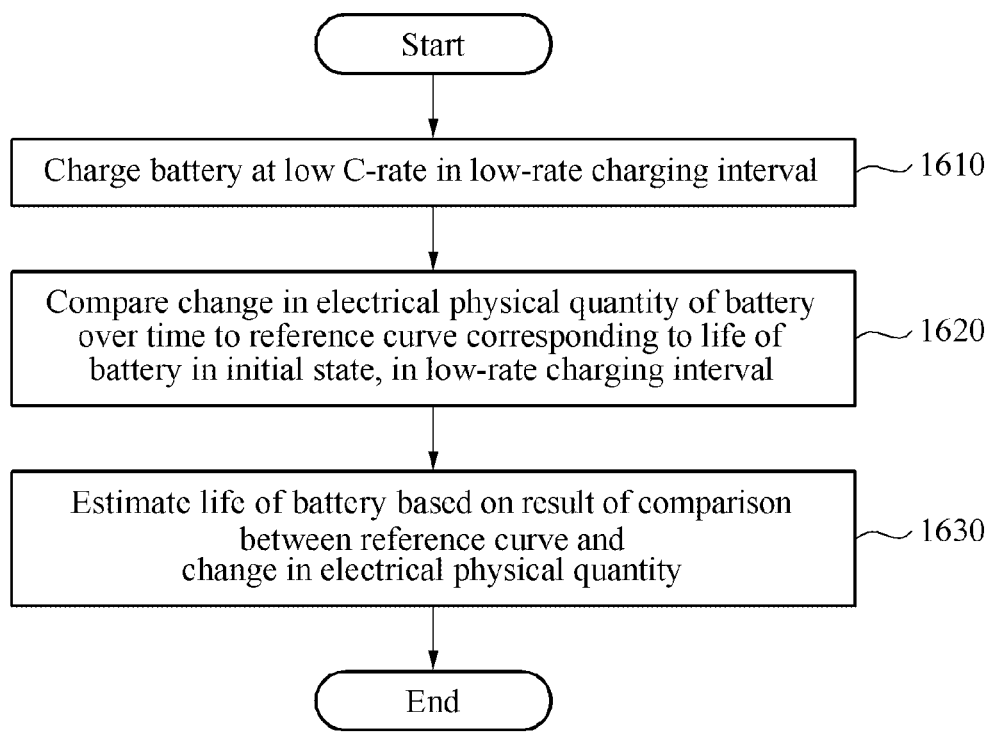
FIG. 16 illustrates an example of a battery life estimation method, according to one or more embodiments.

FIG. 16 illustrates an example of a battery life estimation method, according to one or more embodiments.

Referring to FIG. 16, in operation 1610, a battery life estimation apparatus may charge a battery at a low C-rate in a low-rate charging interval.

In operation 1620, the battery life estimation apparatus may compare a change in an electrical physical quantity of the battery over time to a reference curve corresponding to a life of the battery in an initial state, in the low-rate charging interval.

In operation 1630, the battery life estimation apparatus may estimate a life of the battery based on a result of the comparison between the reference curve and the change in the electrical physical quantity.

The descriptions of FIGS. 1 through 15 are equally applicable to the battery life estimation method of FIG. 16 and accordingly, will not be repeated here.

Figure 17:
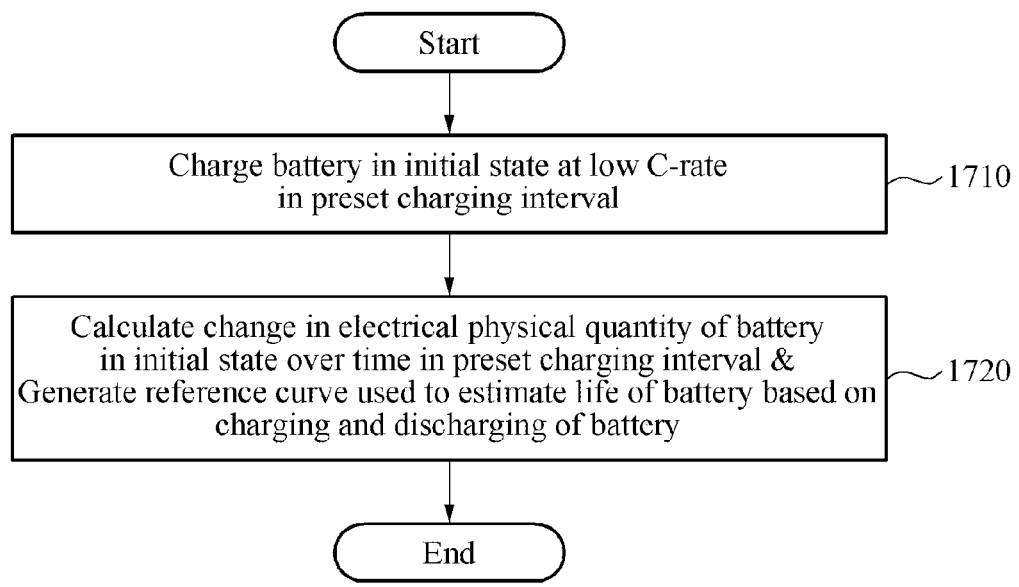
FIG. 17 illustrates an example of a battery life estimation method, according to one or more embodiments.

FIG. 17 illustrates an example of a battery life estimation method, according to one or more embodiments.

Referring to FIG. 17, in operation 1710, a battery life estimation apparatus may charge a battery in an initial state at a low C-rate in a preset charging interval.

In operation 1720, the battery life estimation apparatus may calculate a change in an electrical physical quantity of the battery in the initial state over time in the preset charging interval and generate a reference curve used to estimate a life of the battery based on charging and discharging of the battery.

The descriptions of FIGS. 1 through 15 are equally applicable to the battery life estimation method of FIG. 17 and accordingly, will not be repeated here.

The apparatuses, units, modules, devices, and other components illustrated in FIGS. 5, 6, 14, and 15, for example, that may perform operations described herein with respect to FIGS. 7-13 and 16-17, for example, are implemented by hardware components. Examples of hardware components include controllers, sensors, memory, drivers, and any other electronic components known to one of ordinary skill in the art. In one example, the hardware components are implemented by one or more processing devices, or processors, or computers. A processing device, processor, or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processing device, processor, or computer includes, or is connected to, one or more memories storing instructions or software that are executed by the processing device, processor, or computer and that may control the processing device, processor, or computer to implement one or more methods described herein. Hardware components implemented by a processing device, processor, or computer execute instructions or software, such as an operating system (OS) and one or more software applications that run on the OS, to perform the operations described herein with respect to FIGS. 7-13 and 16-17, for example. The hardware components also access, manipulate, process, create, and store data in response to execution of the instructions or software. For simplicity, the singular term "processing device", "processor", or "computer" may be used in the description of the examples described herein, but in other examples multiple processing devices, processors, or computers are used, or a processing device, processor, or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, remote processing environments, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 7-13 and 16-17 that perform the operations described herein may be performed by a processing device, processor, or a computer as described above executing instructions or software to perform the operations described herein.

Instructions or software to control a processing device, processor, or computer to implement the hardware components and perform the methods as described above may be written as computer programs, code segments, instructions or any combination thereof, for individually or collectively instructing or configuring the processing device, processor, or computer to operate as a machine or special-purpose computer to perform the operations performed by the hardware components and the methods as described above. In one example, the instructions or software include machine code that is directly executed by the processing device, processor, or computer, such as machine code produced by a compiler. In another example, the instructions or software include higher-level code that is executed by the processing device, processor, or computer using an interpreter. Based on the disclosure herein, and after an understanding of the same, programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processing device, processor, or computer to implement the hardware components, such as discussed in any of FIGS. 5, 6, 14, and 15, and perform the methods as described above in any of FIGS. 7-13 and 16-17, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processing device, processor, or computer so that the processing device, processor, or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processing device, processor, or computer.

As a non-exhaustive example only, an electronic device embodiment herein, e.g., that includes an apparatus estimating a state of a battery, as described herein, may be a vehicle, a mobile device, such as a cellular phone, a smart phone, a wearable smart device, a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device capable of wireless or network communication.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is not limited by the detailed description, but further supported by the claims and their equivalents, and all variations within the scope of the claims and their equivalents are to be construed as being included in the disclosure.

What is claimed is:

1. A battery life estimation apparatus comprising:
    a battery charger configured to charge a battery using a normal charge rate (C-rate) during a charging interval of a charging cycle and a low C-rate lower than the normal C-rate during an interval of the low C-rate of the charging cycle; and
    a life estimator configured to use at least one processing device to estimate a life of the battery based on a determined change in an electrical physical quantity of the battery over time, in the interval of the low C-rate.

2. The battery life estimation apparatus of claim 1, wherein the electrical physical quantity is a voltage.

3. The battery life estimation apparatus of claim 1, wherein a C-rate is a unit of measure that represents a rate of a current applied to the battery to charge the battery with respect to a capacity of the battery.

4. The battery life estimation apparatus of claim 1, wherein the battery charger is configured to charge the battery at the low C-rate in the low-rate charging interval based on one of a constant current (CC) charging mode, a constant voltage (CV) charging mode, and a constant power (CP) charging mode implemented for the charging interval.

5. The battery life estimation apparatus of claim 1, wherein the battery charger is configured to set the low-rate charging interval, within the charging cycle, based on at least one of a range of a voltage used to estimate the life of the battery, a charging mode, a current temperature, and a voltage of the battery.

6. The battery life estimation apparatus of claim 5, wherein the battery charger is configured to set the low-rate charging interval, within the charging cycle, based on the voltage of the battery, when the charging mode of the charging interval is a CC charging mode, and
    wherein the battery charger is configured to set the low-rate charging interval, within the charging cycle, based on a current of the battery, when the charging mode of the charging interval is a CV charging mode.

7. The battery life estimation apparatus of claim 1, further comprising a comparator configured to compare the determined change in the electrical physical quantity to a reference curve, corresponding to a life of the battery, for an initial state of the battery.

8. The battery life estimation apparatus of claim 7, wherein the battery charger is configured to charge, when the battery is in the initial state, the battery at the low C-rate in a preset charging interval, and
    wherein the comparator is configured to calculate a change in an electrical physical quantity of the battery in the initial state over time in the preset charging interval, and configured to generate the reference curve based on the calculated change in the electrical physical quantity of the battery in the initial state.

9. The battery life estimation apparatus of claim 8, wherein the preset charging interval comprises an entire initial charging cycle or a preset voltage interval portion of the entire initial charging cycle.

10. The battery life estimation apparatus of claim 7, wherein a plurality of low-rate charging intervals are provided in the charging cycle, and
    wherein the comparator is configured to compare the reference curve to a determined average change in an electrical physical quantity over time in the plurality of low-rate charging intervals.

11. The battery life estimation apparatus of claim 10, wherein the comparator is configured to extract a measure of central tendency of the reference curve and a measure of central tendency of the electrical physical quantity over time in the plurality of low-rate charging intervals, and to compare the extracted measure of central tendency of the reference curve and the extracted measures of central tendency of the electrical physical quantity over time in the plurality of low-rate charging intervals.

12. The battery life estimation apparatus of claim 7, wherein the comparator is configured to compare the reference curve to a change in the electrical physical quantity, within the low-rate charging interval, beginning at a point in time delayed by a preset period of time from a starting point of the low-rate charging interval.

13. The battery life estimation apparatus of claim 7, wherein the reference curve is received from an external apparatus using a communication interface.

14. The battery life estimation apparatus of claim 1, wherein the battery charger is configured to charge the battery at the low C-rate in the low-rate charging interval in response to a determination that a state of the battery satisfies a preset charging condition.

15. The battery life estimation apparatus of claim 14, wherein the preset charging condition comprises at least one of a mileage of a driving vehicle including the battery, a number of times the battery is charged, a charging scheme of the battery, a temperature, and a voltage of the battery.

16. A battery life estimation apparatus comprising:
a battery charger configured to charge a battery, in an initial state of the battery, at a low charge rate (C-rate) lower than a normal C-rate during a preset charging interval of an initial charging cycle; and
a reference curve generator configured to use at least one processing device to calculate a change in an electrical physical quantity of the battery in the initial state over time in the preset charging interval, and to generate a reference curve based on the calculated change in the electrical physical quantity of the battery in the initial state, wherein the reference curve is configured for use in estimating a life of the battery based on charging and discharging of the battery.

17. The battery life estimation apparatus of claim 16, wherein the battery charger is configured to charge the battery using the normal C-rate during a charging interval of another charging cycle and the low C-rate during a low-rate charging interval of the other charging cycle, and
the apparatus further comprises a life estimator configured to use at least one processing device to estimate the life of the battery based on a comparison between the reference curve and a determined change in an electrical physical quantity of the battery over time, in the low-rate charging interval.

18. The battery life estimation apparatus of claim 16, wherein the preset charging interval comprises an entire charging cycle or a preset voltage interval portion of the entire charging cycle.

19. The battery life estimation apparatus of claim 16, further comprising a storage configured to store the reference curve, and wherein the reference curve generator is further configured to store the generated reference curve in the storage.

20. The battery life estimation apparatus of claim 16, wherein the reference curve generator is configured to transmit the reference curve to an external apparatus using a communication interface.

21. A battery life estimation method comprising:
charging a battery using a normal charge rate (C-rate) during a charging interval of a charging cycle and a low C-rate lower than the normal C-rate during an interval of the low C-rate of the charging cycle;
comparing, using at least one processing device, a determined change in an electrical physical quantity of the battery over time, in the interval of the low C-rate, to a reference curve corresponding to a life of the battery and for an initial state of the battery; and
estimating the life of the battery based on a result of the comparing.

22. A battery life estimation method comprising:
charging a battery, in an initial state of the battery, at a low charge rate (C-rate) lower than a normal C-rate during a preset charging interval of an initial charging cycle; and
calculating, using at least one processing device, a change in an electrical physical quantity of the battery in the initial state over time in the preset charging interval and generating a reference curve based on the calculated change in the electrical physical quantity of the battery in the initial state, wherein the reference curve is configured for use in estimating a life of the battery based on charging and discharging of the battery.

23. The battery life estimation method of claim 22, further comprising:
charging the battery using the normal C-rate during a charging interval of another charging cycle and the low C-rate during a low-rate charging interval of the other charging cycle, and
estimating the life of the battery based on a comparison between the reference curve and a determined change in an electrical physical quantity of the battery over time, in the low-rate charging interval.

24. A non-transitory computer-readable storage medium comprising computer readable code to cause the at least one processing device to perform the method of claim 21.

25. A battery life estimation system comprising:
a battery charger configured to charge a battery using a normal charge rate (C-rate) during plural charging intervals of a charging cycle and a low C-rate lower than the normal C-rate during an interval of the low C-rate of the charging cycle; and
a life estimator configured to use at least one processing device to estimate a life of the battery based on a comparison of a determined change in an electrical physical quantity of the battery over time, in the interval of the low C-rate, and battery information previously obtained for a previous charging of the battery using the low C-rate.

26. The battery life estimation apparatus of claim 25, wherein the determined change in an electrical physical quantity of the battery over time, in the low-rate charging interval, is a determined slope of a voltage, over time, of the battery during the low-rate charging interval.

27. The battery life estimation apparatus of claim 26, wherein the determined slope of the voltage of the battery during the low-rate charging interval is a slope of a voltage, over time, across only a lesser portion of the low-rate charging interval.

28. The battery life estimation apparatus of claim 26, wherein the slope of the voltage is a variation in voltage of the battery over time in a charging curve, for the low-rate charging interval, for a current temperature, and
wherein the low C-rate is a C-rate where the slope of the voltage for the current temperature is similar to a slope of a voltage, over time, of another charging of the battery when using the low C-rate at a substantially different temperature, for an interval of voltage values.

29. The battery life estimation apparatus of claim 25, wherein the low C-rate is a C-rate where respective charging curves at substantially different temperatures have similar patterns.

\* \* \* \* \*